US012757591B2

(12) United States Patent
Kang et al.

(10) Patent No.: US 12,757,591 B2
(45) Date of Patent: Oct. 6, 2026

(54) DISPLAY DEVICE AND METHOD OF MANUFACTURING THE SAME

(71) Applicant: Samsung Display Co., Ltd., Yongin-Si (KR)

(72) Inventors: Donghan Kang, Yongin-si (KR); Shinhyuk Yang, Yongin-si (KR); Jeehoon Kim, Yongin-si (KR); Sunggwon Moon, Yongin-si (KR); Seungsok Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 267 days.

(21) Appl. No.: 18/238,540

(22) Filed: Aug. 28, 2023

(65) Prior Publication Data

US 2024/0224643 A1 Jul. 4, 2024

(30) Foreign Application Priority Data

Jan. 3, 2023 (KR) ........................ 10-2023-0000928

(51) Int. Cl.

| | |
|---|---|
| ***H10K 59/131*** | (2023.01) |
| ***H10K 59/12*** | (2023.01) |
| ***H10K 59/123*** | (2023.01) |
| ***H10K 71/16*** | (2023.01) |
| ***H10K 71/20*** | (2023.01) |

(52) U.S. Cl.

CPC ....... *H10K 59/131* (2023.02); *H10K 59/1201* (2023.02); *H10K 59/123* (2023.02); *H10K 71/166* (2023.02); *H10K 71/233* (2023.02)

(58) Field of Classification Search

CPC .... H10K 59/12; H10K 59/123; H10K 59/124; H10K 59/131; H10K 59/1315; H10K 59/80515; H10K 59/80521; H10K 59/80522; H10K 50/11; H10H 29/142

See application file for complete search history.

(56) References Cited

U.S. PATENT DOCUMENTS

| | | | | |
|---|---|---|---|---|
| 9,748,318 | B2 | 8/2017 | Shim et al. | |
| 10,591,787 | B2 | 3/2020 | Shim et al. | |
| 11,101,341 | B2 | 8/2021 | Choi | |
| 11,563,074 | B2 | 1/2023 | Cho | |
| 2017/0062755 | A1 | 3/2017 | Im et al. | |
| 2019/0172898 | A1 * | 6/2019 | Choi .................... | H10K 50/822 |
| 2020/0127220 | A1 | 4/2020 | Kim et al. | |

(Continued)

FOREIGN PATENT DOCUMENTS

| | | | |
|---|---|---|---|
| CN | 113871430 | A | 12/2021 |
| KR | 10-2016-0119301 | A | 10/2016 |

(Continued)

*Primary Examiner* — Fazli Erdem

(74) *Attorney, Agent, or Firm* — Innovation Counsel LLP

(57) ABSTRACT

A display device includes a substrate having a display area and a contact area located in the display area, a power line in the display area on the substrate, overlapping the contact area, and including a first conductive layer and a second conductive layer on the first conductive layer, a passivation layer on the substrate and the power line and having a protrusion protruding in a first direction with respect to an edge of an upper surface of the first conductive layer in the contact area, and a common electrode on the substrate and the passivation layer and electrically connected to the power line in the contact area.

16 Claims, 24 Drawing Sheets

(56) References Cited

U.S. PATENT DOCUMENTS

| | | | | |
|---|---|---|---|---|
| 2021/0408441 | A1 | 12/2021 | Lee et al. | |
| 2022/0102471 | A1* | 3/2022 | Jang | H10K 59/131 |
| 2022/0165980 | A1 | 5/2022 | Shim et al. | |
| 2024/0251635 | A1 | 7/2024 | Tang | |

FOREIGN PATENT DOCUMENTS

| | | | |
|---|---|---|---|
| KR | 10-2018-0047584 | A | 5/2018 |
| KR | 10-2019-0066495 | A | 6/2019 |
| KR | 10-2020-0046221 | A | 5/2020 |
| KR | 10-2021-0086869 | A | 7/2021 |
| KR | 10-2021-0158617 | A | 12/2021 |
| KR | 10-2022-0069361 | A | 5/2022 |

* cited by examiner

DISPLAY DEVICE AND METHOD OF MANUFACTURING THE SAME

This application claims priority to Korean Patent Application No. 10-2023-0000928 filed on Jan. 3, 2023, and all the benefits accruing therefrom under 35 U.S.C. § 119, the content of which in its entirety is herein incorporated by reference.

BACKGROUND

1. Field

The disclosure relates to a display device and a method of manufacturing the display device. More specifically, the disclosure relates to a display device capable of preventing a voltage drop and a method of manufacturing the display device.

2. Description of the Related Art

A display device includes light emitting devices, and the light emitting devices include a common electrode formed of a plate electrode. As the size of the display device increases, the display quality of the display device may deteriorate due to a drop in voltage provided to the common electrode. Accordingly, a structure for preventing a voltage drop of the voltage provided to the common electrode is being developed.

SUMMARY

A display device in accordance with some examples of the present disclosure may prevent a voltage drop.

Some examples of the present disclosure may provide a method for manufacturing the display device.

A display device according to some examples disclosed herein may include a substrate having a display area and a contact area located in the display area, a power line disposed in the display area on the substrate, overlapping the contact area, and including a first conductive layer and a second conductive layer disposed on the first conductive layer, a passivation layer disposed on the substrate and the power line and having a protrusion protruding in a first direction with respect to an edge of an upper surface of the first conductive layer in the contact area, and a common electrode disposed on the substrate and the passivation layer and electrically connected to the power line in the contact area.

In the contact area of some specific examples disclosed herein, the passivation layer may expose a side surface of the first conductive layer extending from the edge of the upper surface of the first conductive layer.

In some cases, an undercut shape may be defined in the contact area by the side surface of the first conductive layer and the protrusion.

In some cases, the display device may further include a capping electrode which is disconnected by the protrusion and contacts the side surface of the first conductive layer in the contact area.

In some cases, the common electrode may be electrically connected to the power line through the capping electrode.

In some cases, the capping electrode may cover the side surface of the first conductive layer.

In some cases, the display device may further include a transistor in the display area on the substrate and a pixel electrode on the transistor and electrically connected to the transistor, and the capping electrode and the pixel electrode may be on a same layer.

In some cases, the common electrode may contact the side surface of the first conductive layer.

In some cases, in the contact area, the passivation layer may cover a side surface of the second conductive layer extending from an edge of an upper surface of the second conductive layer.

In some cases, in the contact area, the edge of the upper surface of the second conductive layer may protrude in the first direction beyond the edge of the upper surface of the first conductive layer.

In some cases, in the contact area, the edge of the upper surface of the second conductive layer may be recessed in a second direction (opposite to the first direction) relative to the edge of the upper surface of the first conductive layer.

In some cases, the display device may further include a via insulation layer on the passivation layer and exposing at least a portion of the protrusion and a thin film inorganic layer between the passivation layer and the via insulation layer.

In some cases, in the contact area, the via insulation layer may cover an entire of the passivation layer except for at least a portion of the protrusion.

In some cases, a thickness of the thin film inorganic layer may be smaller than a thickness of the passivation layer.

In some cases, the first conductive layer may include at least one conductor out of copper (Cu) and aluminum (Al), and the second conductive layer may include at least one of a transparent conductive oxide, titanium (Ti), and molybdenum (Mo).

In some cases, the passivation layer may include an inorganic insulating material.

In some cases, the display device may further include an emission layer which is disconnected by the protrusion in the contact area.

In some cases, the display device may further include a pad electrode disposed in a pad area located at one side of the display area on the substrate and disposed on the same layer as the power line, and the passivation layer may expose at least a portion of an upper surface of the pad electrode.

A method of manufacturing a display device according to an example disclosed herein may include preparing a substrate having a display area and a contact area located in the display area, forming a preliminary metal layer on the substrate, and forming a photoresist pattern including a first portion having a first thickness and a second portion having a second thickness thinner than the first thickness on the preliminary metal layer, forming a power line overlapping the contact area and including a first conductive layer and a second conductive layer on the first conductive layer in the display area on the substrate by patterning the preliminary metal layer using the photoresist pattern as a mask, exposing a portion of an upper surface of the second conductive layer by removing a portion of the photoresist pattern, exposing a portion of an upper surface of the first conductive layer by removing a portion of the second conductive layer that the photoresist pattern exposes, forming a passivation layer exposing a portion of the first conductive layer in the contact area on the substrate and the power line, removing a portion of the first conductive layer that the passivation layer exposes so that the passivation layer has a protrusion protruding in a first direction with respect to an edge of the upper surface of the first conductive layer in the contact area, and forming a common electrode electrically connected to the power line in the contact area on the substrate and the passivation layer.

In some cases, after removing a portion of the first conductive layer, an undercut shape may be defined by a side surface of the first conductive layer extending from the edge of the upper surface of the first conductive layer and the protrusion.

In some cases, the removing of a portion of the first conductive layer may be performed by a wet etching process.

In some cases, the passivation layer may be formed of an inorganic insulating material.

In some cases, the forming of the photoresist pattern may include forming a preliminary photoresist layer on the preliminary metal layer and patterning the preliminary photoresist layer using a halftone mask.

In some cases, the method may further include forming a preliminary inorganic layer covering the passivation layer and a portion of the first conductive layer exposed by the passivation layer on the substrate and forming a via insulation layer on the preliminary inorganic layer to expose a portion of the preliminary inorganic layer, and the forming of the preliminary inorganic layer and forming of the via insulation layer may be performed before the removing a portion of the first conductive layer.

In some cases, in the removing of a portion of the first conductive layer, also removes a portion of the preliminary inorganic layer exposed by the via insulation layer to form a thin film inorganic layer.

In some cases, the method may further include forming a transistor in the display area on the substrate and forming a pixel electrode electrically connected to the transistor on the transistor, and forming a capping electrode that is disconnected by the protrusion and contacts a side surface of the first conductive electrode extending from the edge of the upper surface of the first conductive layer. The forming of the transistor, the forming of the pixel electrode, and the forming of the capping electrode may be performed before the forming of the common electrode.

In some cases, the method may further include forming an emission layer on the substrate to be disconnected by the protrusion in the contact area, and the forming of the emission layer may be performed before the forming of the common electrode.

The display device according to examples disclosed herein may include a power line, a passivation layer, and a common electrode. The power line may include a first conductive layer and a second conductive layer on the first conductive layer. In addition, in a contact area, the passivation layer may have a protrusion protruding in one direction with respect to an edge of an upper surface of the first conductive layer.

Accordingly, the display device may have an undercut shape defined by the protrusion of the passivation layer and the side surface of the first conductive layer. Accordingly, the common electrode may be electrically connected to the power line in the contact area. Accordingly, a voltage drop of the common voltage provided to the common electrode may be prevented or reduced. Accordingly, the display quality of the display device may be improved.

It is to be understood that both the foregoing general description and the following detailed description are exemplary and explanatory and are intended to provide further explanation of the disclosure as claimed.

BRIEF DESCRIPTION OF THE DRAWINGS

Illustrative, non-limiting examples will be more clearly understood from the following detailed description taken in conjunction with the accompanying drawings.

DETAILED DESCRIPTION

Figure 1:
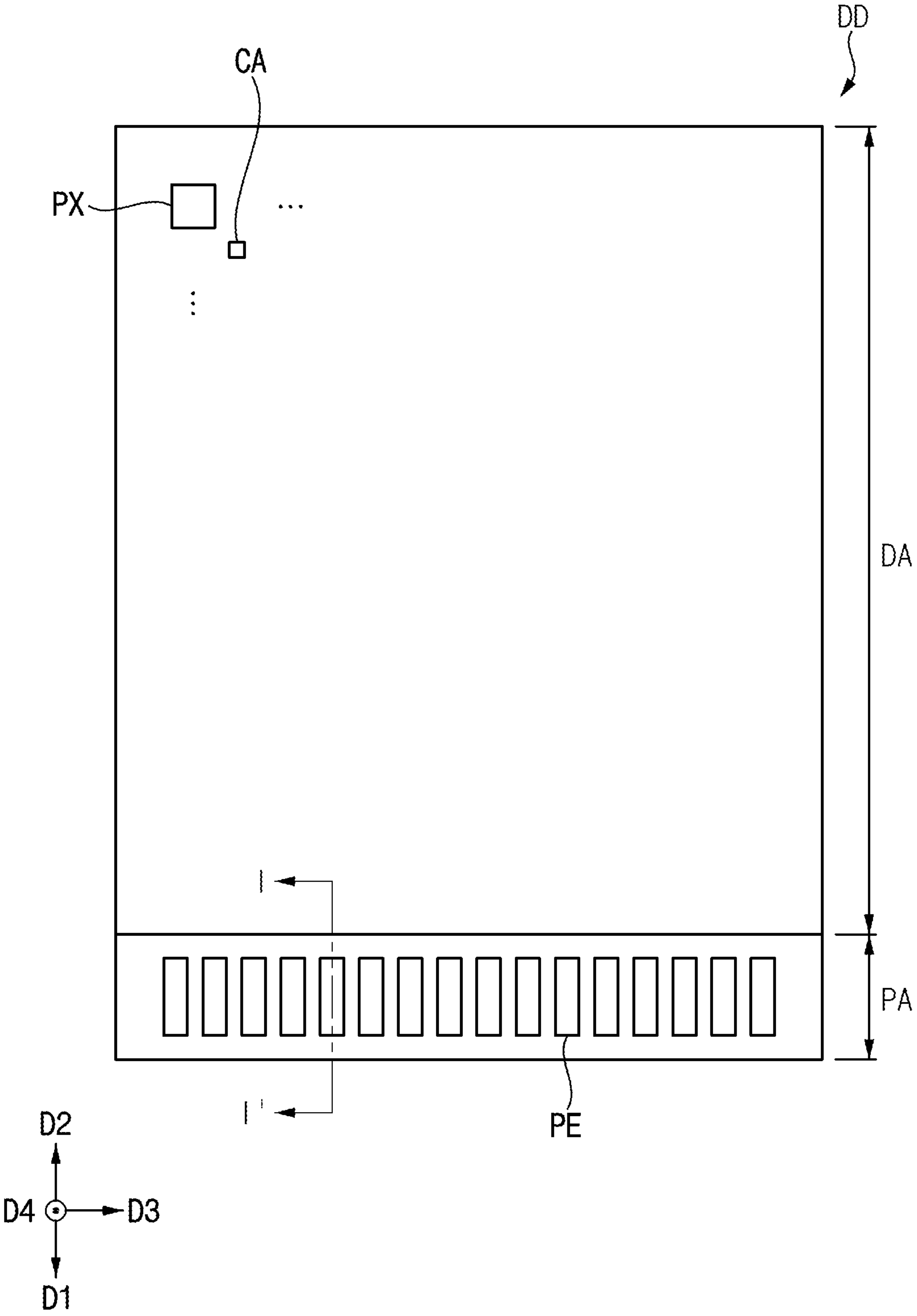
FIG. 1 is a plan view illustrating a display device according to one example of the present disclosure.

Devices and methods in accordance with the present disclosure are be described more fully hereinafter with reference to the accompanying drawings, in which various examples are shown. The inventive concept may, however, be embodied in many different forms, and should not be construed as limited to the examples set forth herein. Rather, these examples are provided so that this disclosure will be thorough and complete, and will fully convey the scope of the disclosure to those skilled in the art. Like reference numerals refer to like elements throughout.

FIG. 1 is a plan view illustrating a display device according to an example of the present disclosure.

Referring to FIG. 1, a display device DD (e.g., a substrate SUB of FIG. 4) may include a display area DA and a pad area PA. In some cases, the pad area PA may be located on at least one side of the display area DA. For example, as shown in FIG. 1, the pad area PA may be offset in a first direction D1 from the display area DA. In other words, the display area DA may be offset in a second direction D2 from the pad area PA. Here, the second direction D2 may be a direction opposite to the first direction D1. However, the present inventive concept is not necessarily limited thereto.

At least one pixel PX may be disposed in the display area DA. For example, each pixel PX may be entirely within the display area DA and may occupy an area extending along the first direction D1 and a third direction D3 crossing the first direction D1. Each pixel PX would typically be one of many pixels forming a two-dimensional pixel array in the display area DA.

Each pixel PX may include a light emitting device which generates light and a transistor that drives the light emitting device. For example, the light emitting device may include an organic light emitting diode. For another example, the light emitting device may include a nano light emitting diode. The transistor may be, for example, a thin film transistor (TFT). A portion of an image may be displayed on the display area DA of the display device DD through the pixel PX including the light emitting device and the transistor. For example, in the display area DA, an image may be displayed in or viewable from a fourth direction D4 orthogonal to the first direction D1, the second direction D2, and the third direction D3.

In some cases, a contact area CA may be located in the display area DA. The contact area CA may be defined as an area where a portion of a passivation layer (e.g., a passivation layer PVX of FIG. 4) disposed on a power line (e.g., the power line VL of FIG. 4) exposes a portion of the power line VL to electrically connect a common electrode (e.g., a common electrode CTE of FIG. 4) to the power line VL. This will be described later in more detail with reference to FIGS. 4 and 5.

Pad electrodes PE may be disposed in the pad area PA. For example, the pad electrodes PE may be arranged along the third direction D3. The pad electrodes PE may be electrically connected to an external device. That is, the pad electrodes PE may electrically connect the external device and the pixel PX.

The external device may be electrically connected to the display device DD through a flexible printed circuit board or a printed circuit board. For example, one side of the flexible printed circuit board may directly contact the pad electrodes PE, and the other side of the flexible printed circuit board may directly contact the external device. The external device may provide a data signal, a gate signal, a light emission control signal, a gate initialization signal, an initialization voltage, and a power supply voltage to the display device DD. In addition, a driving integrated circuit may be mounted on the flexible printed circuit board. In other cases, the driving integrated circuit may be mounted on the display device DD adjacent to the pad electrodes PE.

In FIG. 1, each of the display area DA and the pad area PA is illustrated as having a quadrangular planar shape, but the present disclosure is not necessarily limited thereto. For example, each of the display area DA and the pad area PA may have another shape such as the shape of a triangle, a polygon, a circle, or an ellipse. Also, the shape of either or both of the display area DA and the pad area PA may have a curvature.

In addition, FIG. 1 illustrates that a width of the pad area PA extending in the third direction D3 is the same as a width of the display area DA extending in the third direction D3, but the present inventive concept is necessarily limited thereto. For example, the width of the pad area PA in the third direction D3 may be smaller than the width of the display area DA in the third direction D3.

Figure 2:
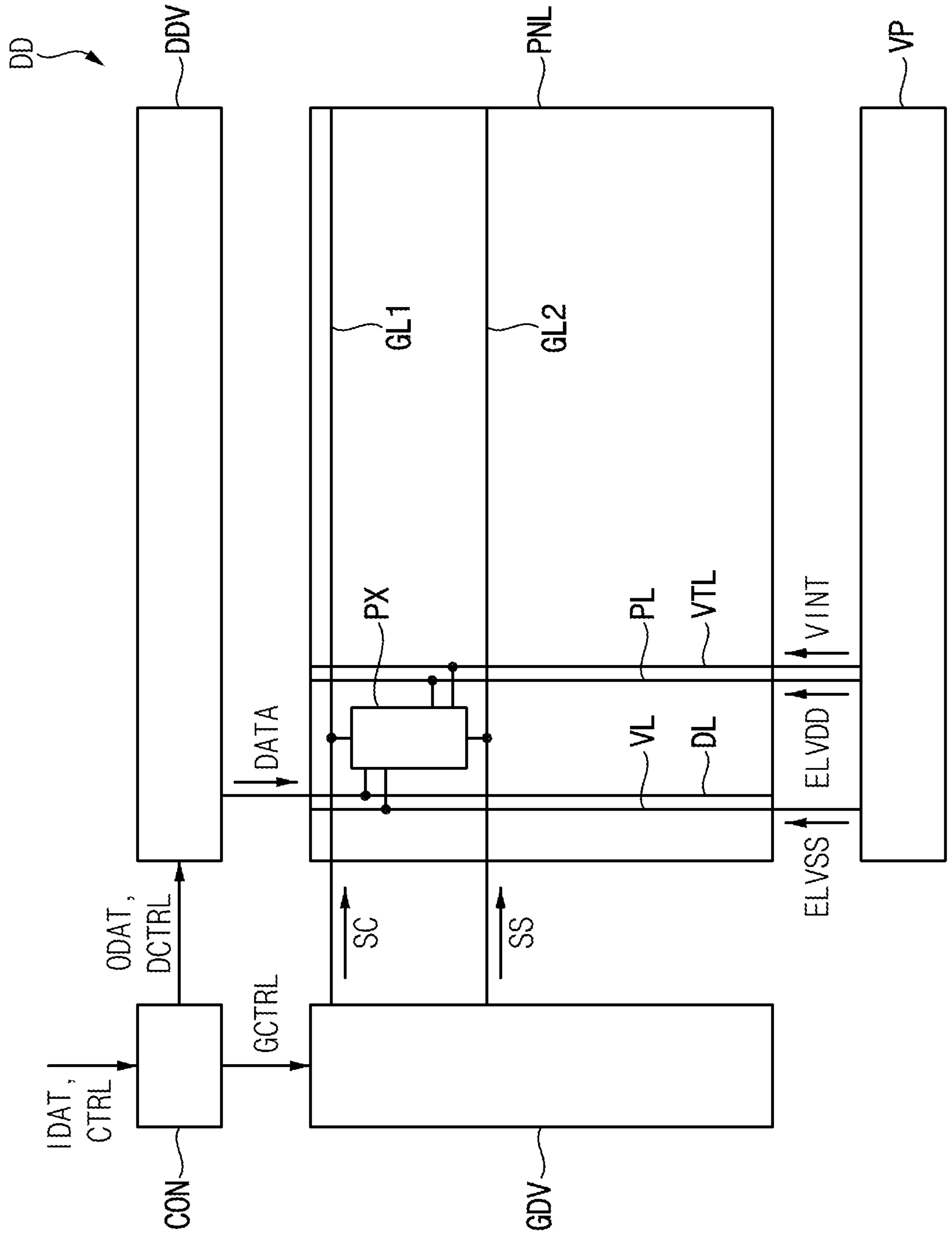
FIG. 2 is a block diagram illustrating the display device of FIG. 1.

FIG. 2 is a block diagram illustrating the display device DD of FIG. 1.

Referring to FIG. 2, the display device DD may include a display panel PNL, a data driver DDV, a gate driver GDV, a controller CON, and a voltage supply part VP.

The display panel PNL may include at least one pixel PX.

The pixel PX may receive a first gate signal SC through a first gate line GL1 and receive a second gate signal SS through a second gate line GL2. In addition, the pixel PX may receive a data voltage DATA through a data line DL and an initialization voltage VINT through an initialization voltage line VTL. The data voltage DATA may be applied in the pixel PX in response to the first gate signal SC, and the initialization voltage VINT may be applied in the pixel PX in response to the second gate signal SS.

The data driver DDV may generate the data voltage DATA based on an output image data ODAT and a data control signal DCTRL. For example, the data driver DDV may generate the data voltage DATA corresponding to the output image data ODAT and output the data voltage DATA in response to the data control signal DCTRL. The data control signal DCTRL may include an output data enable signal, a horizontal start signal, and a load signal.

The gate driver GDV may generate first and second gate signals SC and SS based on a gate control signal GCTRL. For example, each of the first gate signal SC and the second gate signal SS may include a gate-on voltage for turning on the transistor in the pixel PX and a gate-off voltage for turning off the transistor in the pixel PX. The gate control signal GCTRL may include a vertical start signal and a clock signal.

The controller CON (e.g., timing controller T-CON) may receive an input image data IDAT and a control signal CTRL from an external host processor (e.g., GPU). For example, the input image data IDAT may be RGB data including red image data, green image data, and blue image data. The control signal CTRL may include a vertical sync signal, a horizontal sync signal, an input data enable signal, a master clock signal, or the like. The controller CON may generate the gate control signal GCTRL, the data control signal DCTRL, and the output image data ODAT based on the input image data IDAT and the control signal CTRL.

The voltage supply part VP may provide a driving voltage ELVDD, a common voltage ELVSS, and the initialization voltage VINT to the pixel PX. The driving voltage ELVDD may be provided to the pixel PX through the driving line PL. The common voltage ELVSS may be provided to the pixel PX through the power line VL and the common electrode (e.g., the common electrode CTE of FIG. 4). In other words, the power line VL may transfer the common voltage ELVSS to the common electrode CTE. The power line VL may prevent a voltage drop of the common voltage ELVSS.

Figure 3:
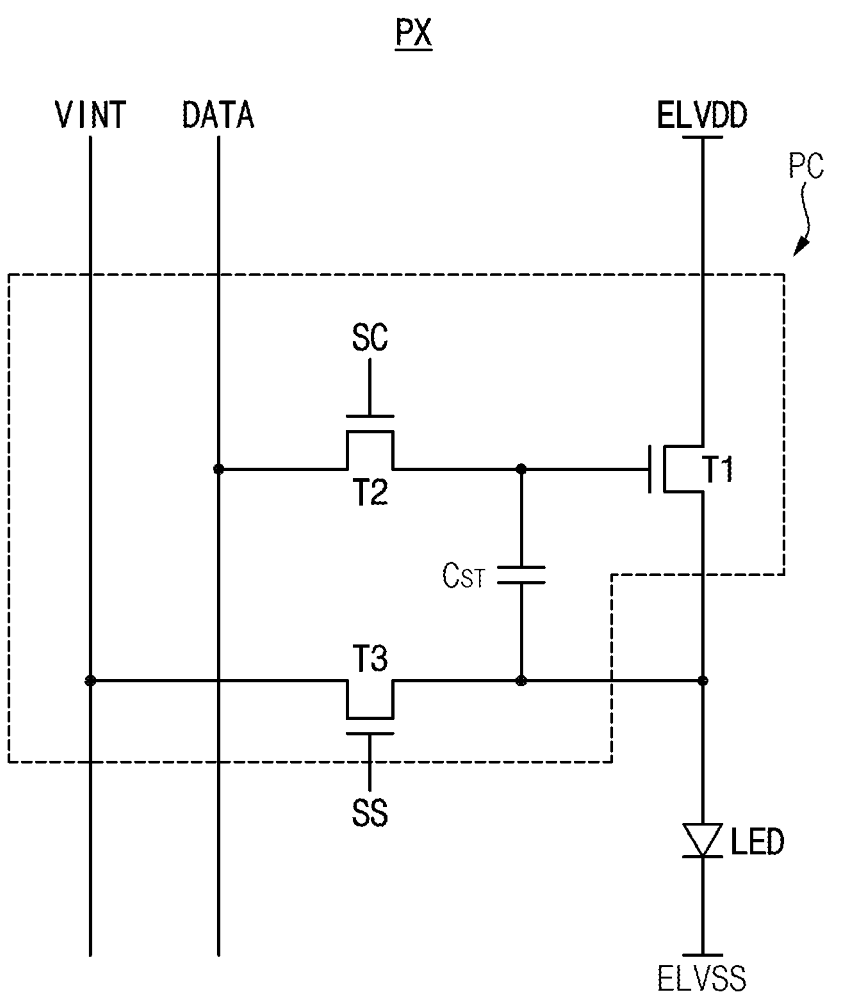
FIG. 3 is a circuit diagram illustrating the pixel included in the display device of FIG. 1.

FIG. 3 is a circuit diagram illustrating the pixel PX included in the display device DD of FIG. 1.

Referring to FIG. 3, the pixel PX may include a pixel circuit PC and a light emitting device LED. The pixel circuit PC may be electrically connected to the light emitting device LED. The pixel circuit PC may include a first transistor T1, a second transistor T2, a third transistor T3, and a storage capacitor CST.

The first transistor T1 may include a first terminal, a second terminal, and a gate terminal. The first terminal may receive the driving voltage ELVDD. The second terminal may be connected to the light emitting device LED. The gate terminal may be connected to the second transistor T2. The first transistor T1 may generate a driving current based on the driving voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transmit the data voltage DATA in response to the first gate signal SC.

The third transistor T3 may include a first terminal, a second terminal, and a gate terminal. The first terminal may be connected to the first transistor T1. The second terminal may receive the initialization voltage VINT. The gate terminal may receive the second gate signal SS. The third transistor T3 may transfer the initialization voltage VINT in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain a voltage level of the gate terminal of the first transistor T1 during an inactive period of the first gate signal SC.

The light emitting device LED may include a first terminal and a second terminal. The first terminal may be connected to the second terminal of the first transistor T1. The second terminal of the light emitting device LED may receive the common voltage ELVSS. The light emitting device LED may emit light having luminance corresponding to the driving current. The light emitting device LED may include an organic light emitting device using an organic material as an emission layer, an inorganic light emitting device using an inorganic material as an emission layer, or the like.

The connection structure of the pixel PX illustrated in FIG. 3 is only an example and may be variously changed.

Figure 4:
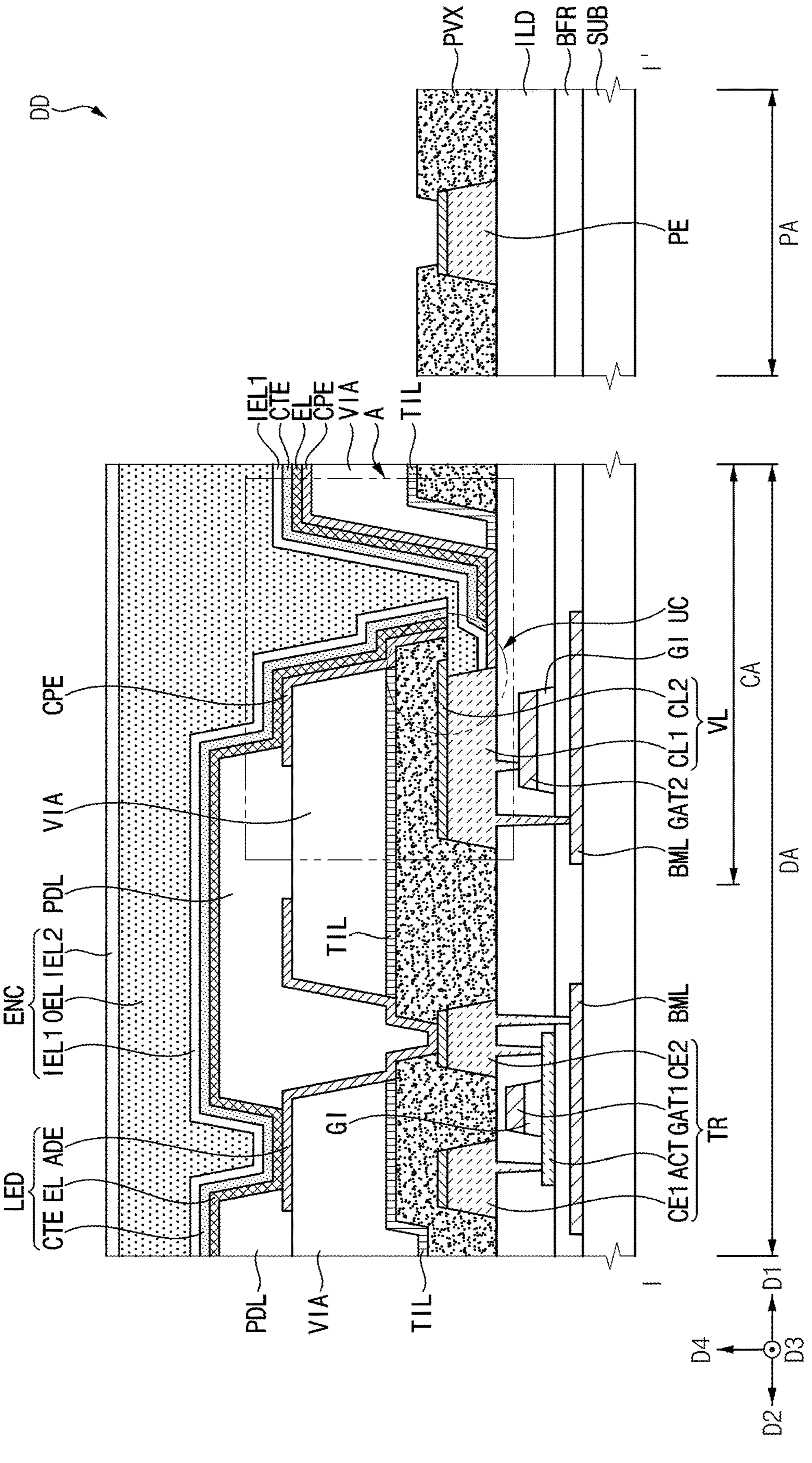
FIG. 4 is a cross-sectional view of the display device of FIG. 1.
Figure 5:
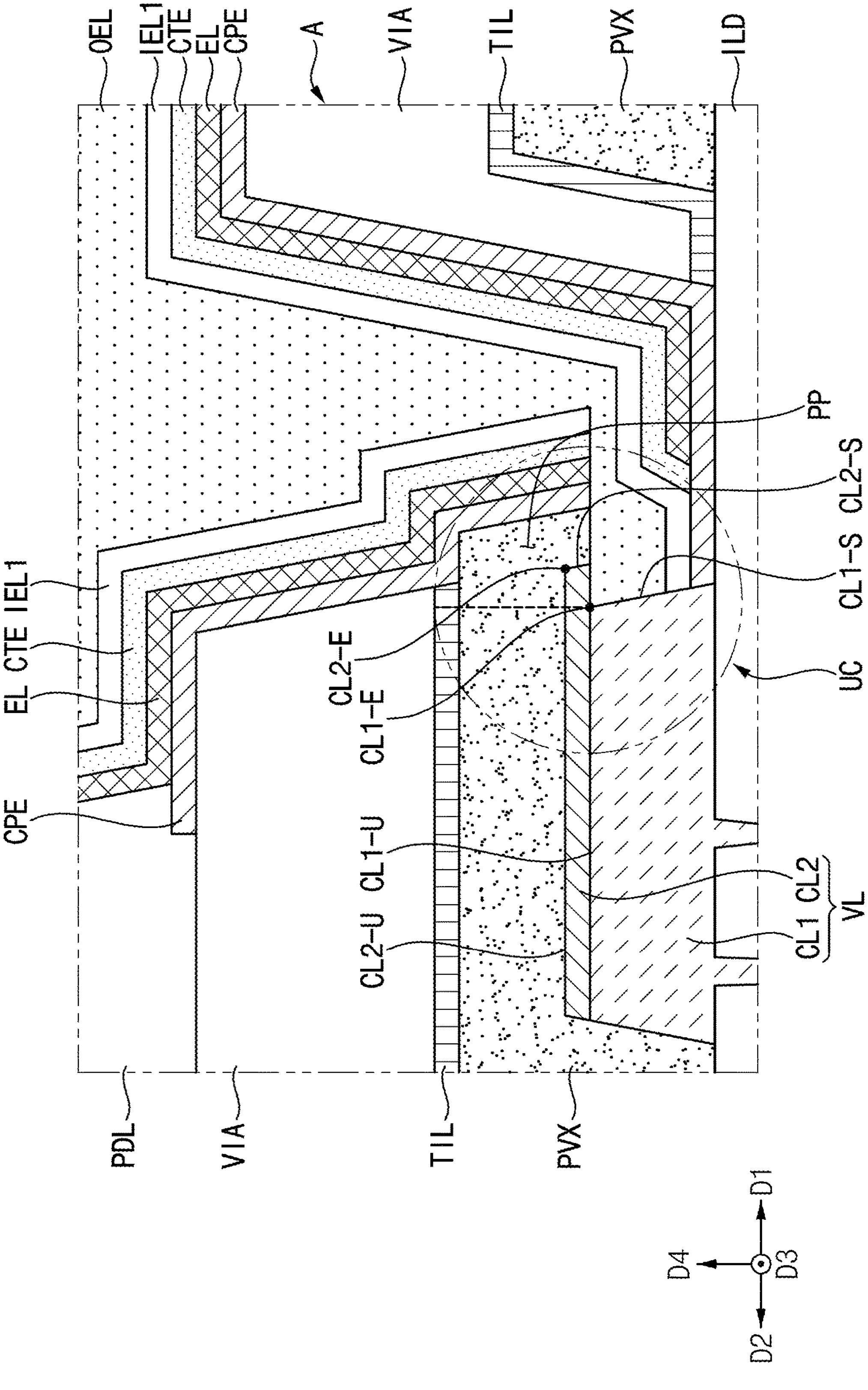
FIG. 5 is an enlarged view of area A of FIG. 4.

FIG. 4 is a cross-sectional view of the display device DD of FIG. 1, and FIG. 5 is an enlarged view of area A of FIG. 4. For example, FIG. 4 may be a cross-sectional view taken along line I-I' of FIG. 1.

Referring to FIGS. 1, 4, and 5, the display device DD according to the illustrated example may include a substrate SUB, a lower metal layer BML, a buffer layer BFR, a gate insulation layer GI, an interlayer dielectric or insulation layer ILD, a transistor TR, a power line VL, a pad electrode PE, a passivation layer PVX, a thin film inorganic layer TIL, a via insulation layer VIA, a pixel defining layer PDL, a light emitting device LED, and an encapsulation layer ENC. A transistor TR (e.g., transistor T3 in FIG. 3) may include an active pattern ACT, a first gate electrode GAT1, a first connection electrode CE1, and a second connection electrode CE2, and the light emitting device LED may include a pixel electrode ADE, an emission layer EL, and a common electrode CTE. The encapsulation layer ENC may include a first inorganic encapsulation layer IEL1, an organic encapsulation layer OEL, and a second inorganic encapsulation layer IEL2.

The substrate SUB may include a transparent or opaque material. Examples of materials that can be used as the substrate SUB may include glass, quartz, plastic, or the like. These materials may be used alone or in combination with each other.

The lower metal layer BML may be disposed on the substrate SUB. In some cases, the lower metal layer BML may be formed of a metal, an alloy, a conductive metal oxide, a transparent conductive material, or the like.

The buffer layer BFR may be disposed on the substrate SUB and cover the lower metal layer BML. In some cases, the buffer layer BFR may be entirely disposed in the display area DA and the pad area PA on the substrate SUB. The buffer layer BFR may prevent diffusion of impurities such as oxygen, moisture, or the like to an upper portion of the substrate SUB through the substrate SUB. The buffer layer BFR may include an inorganic insulating material such as a silicon compound or a metal oxide. The buffer layer BFR may have a single-layer structure or a multi-layer structure including multiple insulating layers.

The active pattern ACT may be disposed in the display area DA on the buffer layer BFR. In an embodiment, the active pattern ACT may be formed of a silicon semiconductor material or an oxide semiconductor material. Examples of silicon semiconductor materials that can be used as the active pattern ACT may include amorphous silicon and polycrystalline silicon.

The gate insulation layer GI may be disposed on the active pattern ACT. In some cases, the gate insulation layer GI may be formed of an insulating material. Examples of an insulating material that can be used as the gate insulation layer GI may include silicon oxide, silicon nitride, silicon oxynitride, or the like. These materials may be used alone or in combination with each other. In the example shown in FIG. 4, the gate insulation layer GI may be disposed on the buffer layer BFR and the active pattern ACT in the form of a pattern. However, the present inventive concept is not necessarily limited thereto, and in another embodiment, the gate insulating layer GI may be entirely formed on the buffer layer BFR to cover the active pattern ACT.

The first gate electrode GAT1 and the second gate electrode GAT2 may be disposed in the display area DA on the gate insulation layer GI. In some cases, the first gate electrode GAT1 and the second gate electrode GAT2 may be formed together in the same process. In other words, the first gate electrode GAT1 and the second gate electrode GAT2 may be disposed on the same layer. Further, the first gate electrode GAT1 and the second gate electrode GAT2 may include the same material. For example, each of the first gate electrode GAT1 and the second gate electrode GAT2 may include a metal, an alloy, a conductive metal oxide, a transparent conductive material, or the like.

The interlayer insulation layer ILD may be disposed on the buffer layer BFR, the gate insulation layer GI, the first gate electrode GAT1, and the second gate electrode GAT2. The interlayer insulation layer ILD may cover the first gate electrode GAT1 and the second gate electrode GAT2. In some cases, the interlayer insulation layer ILD may be entirely disposed in the display area DA and the pad area PA on the substrate SUB. In some cases, the interlayer insulation layer ILD may be formed of an inorganic insulating material. Examples of inorganic insulating materials that can be used as the interlayer insulation layer ILD may include silicon oxide, silicon nitride, silicon oxynitride, or the like. These may be used alone or in combination with each other.

The first connection electrode CE1 and the second connection electrode CE2 may be disposed in the display area DA on the interlayer insulation layer ILD. Each of the first connection electrode CE1 and the second connection electrode CE2 may pass through the interlayer insulation layer ILD and contact the active pattern ACT. Also, the second connection electrode CE2 may pass through the interlayer insulation layer ILD and the buffer layer BFR to contact the lower metal layer BML. In some cases, each of the first connection electrode CE1 and the second connection electrode CE2 may include multiple conductive layers.

The active pattern ACT, the first gate electrode GAT1, the first connection electrode CE1, and the second connection electrode CE2 may form the transistor TR. In other words, the transistor TR may be disposed in the display area DA on the substrate SUB. For example, the transistor TR may correspond to at least one of the first to third transistors T1, T2, and T3 described with reference to FIG. 3.

The pad electrode PE may be disposed in the pad area PA on the interlayer insulation layer ILD. That is, the pad electrode PE may be disposed in the pad area PA on the substrate SUB. In some cases, the pad electrode PE may be formed together with the first connection electrode CE1 and the second connection electrode CE2 in the same process. In other words, the pad electrode PE, the first connection electrode CE1, and the second connection electrode CE2 may be disposed on the same layer. Further, the pad electrode PE, the first connection electrode CE1, and the second connection electrode CE2 may include the same material. In some cases, each of the first connection electrode CE1 and the second connection electrode CE2 may include multiple conductive layers.

The power line VL may be disposed in the display area DA on the interlayer insulation layer ILD. Specifically, the power line VL may overlap the contact area CA in the display area DA. As described above, the contact area may be defined as an area where a portion of the passivation layer PVX disposed on the power line VL exposes a portion of the power line VL for electrical connection of the common electrode CTE to the power line VL.

The power line VL may pass through the interlayer insulation layer ILD and contact the second gate electrode GAT2. In addition, the power line VL may pass through the interlayer insulation layer ILD and the buffer layer BFR to contact the lower metal layer BML.

In some cases, the power line VL may be formed together with the first connection electrode CE1 and the second connection electrode CE2 in the same process. In particular, the power line VL, the first connection electrode CE1, and the second connection electrode CE2 may be disposed on the same layer, and the power line VL, the first connection electrode CE1, and the second connection electrode CE2 may include the same material.

In some cases, the power line VL may include a first conductive layer CL1 and a second conductive layer CL2 disposed on the first conductive layer CL1.

In some cases, the first conductive layer CL1 and the second conductive layer CL2 may include different materials. For example, the first conductive layer CL1 may include a metal material, and the second conductive layer CL2 may include a metal material different from the metal material included in the first conductive layer CL1 and/or include a transparent conductive oxide.

Examples of the metal material that can be used as the first conductive layer CL1 may include copper (Cu), aluminum (Al), or the like. Specifically, the first conductive layer CL1 may include copper (Cu). Examples of the metal material that can be used as the second conductive layer CL2 may include titanium (Ti), molybdenum (Mo), or the like. Examples of the transparent conductive oxide that can be used as the second conductive layer CL2 may include indium tin oxide (ITO), indium zinc oxide (IZO), zinc oxide (ZnO), indium oxide ($In_2O_3$), indium gallium oxide (IGO), aluminum zinc oxide (AZO), or the like. Specifically, the second conductive layer CL2 may include indium tin oxide (ITO).

Meanwhile, although the power line VL is illustrated as having a two-layer structure in FIG. 4, the power line VL is not necessarily limited thereto. In another embodiment, the power line VL may have a multilayer structure of three or more layers.

The passivation layer PVX may be disposed on the interlayer insulation layer ILD, the first connection electrode CE1, the second connection electrode CE2, the power line VL, and the pad electrode PE. For example, the passivation layer PVX may be entirely disposed in the display area DA and the pad area PA on the interlayer insulation layer ILD.

In some cases, the passivation layer PVX may be formed of an inorganic insulating material. Examples of the inorganic insulating material that can be used as the passivation layer PVX may include silicon oxide, silicon nitride, silicon oxynitride, or the like. These may be used alone or in combination with each other. In addition, the passivation layer PVX may have a single-layer structure or a multi-layer structure.

In some cases, the passivation layer PVX disposed in the pad area PA may be patterned to expose at least a portion of an upper surface of the pad electrode PE. Accordingly, the external device may be electrically connected to the pad electrode PE.

As shown in FIG. 4 and in more detail in FIG. 5, the passivation layer PVX may have a protrusion PP in the contact area CA. Here, the protrusion PP may refer to a portion of the passivation layer PVX protruding in the first direction D1 with respect to an edge CL1-E of the upper surface CL1-U of a region of the first conductive layer CL1 under the passivation layer PVX. That is, a side surface of the passivation layer PVX on the power line VL may protrude further in the first direction D1 than a side surface CL1-S of an underlying region of the first conductive layer CL1.

Here, the side surface CL1-S of the first conductive layer CL1 may be a surface extending in one direction from the edge CL1-E of the upper surface CL1-U of the first conductive layer CL1. In some cases, the side surface CL1-S of the first conductive layer CL1 extend in a direction opposite to the fourth direction D4 from the edge CL1-E of the upper surface CL1-U of the first conductive layer CL1 with a predetermined inclination angle relative to the fourth direction D4.

As described above, the passivation layer PVX may expose a portion of the power line VL in the contact area CA. Specifically, the passivation layer PVX may expose the side surface CL1-S of the first conductive layer CL1.

The protrusion PP may define an undercut shape UC along with the side surface CL1-S of the first conductive layer CL1. That is, the protrusion PP and the side surface CL1-S of the first conductive layer CL1 may define the undercut shape UC in the contact area CA.

For example, in a process of manufacturing the display device DD, a portion of the first conductive layer CL1 overlapping the passivation layer PVX in the contact area CA may be removed through an etching process. Accordingly, a structure in which a portion of the passivation layer PVX protrudes further in the first direction D1 than does the underlying region of the first conductive layer CL1 may be formed. Accordingly, the undercut shape UC may be defined in the contact area CA. This will be described later in more detail with reference to FIGS. 13 and 14.

In some cases, an edge CL2-E of an upper surface CL2-U of the second conductive layer CL2 may protrude further in the first direction D1 than does the edge CL1-E of the upper surface CL1-U of the first conductive layer CL1. In other words, the side surface CL2-S of the second conductive layer CL2 may protrude in the first direction D1 beyond the side surface CL1-S of the first conductive layer CL1.

Here, the side surface CL2-S of the second conductive layer CL2 may be a surface extending from the edge CL2-E of the upper surface CL2-U of the second conductive layer CL2. In some cases, the side surface CL2-S of the second conductive layer CL2 may extend in a direction generally opposite (e.g., with a predetermined inclination angle) to the fourth direction D4 from the edge CL2-E of the upper surface CL2-U of the second conductive layer CL2.

Accordingly, in a plan view, a portion of the second conductive layer CL2 may overlap the protrusion PP of the passivation layer PVX. Meanwhile, the passivation layer PVX may cover the side surface CL2-S of the second conductive layer CL2.

The via insulation layer VIA may be disposed on the passivation layer PVX. In some cases, the via insulation layer VIA may be disposed in the display area DA on the passivation layer PVX.

In some cases, the via insulation layer VIA may be formed of an organic insulating material. Examples of the organic insulating materials that can be used as the via insulation layer VIA may include photoresist, polyacrylic resin, polyimide resin, acrylic resin, or the like. These may be used alone or in combination with each other.

As shown in FIG. 5, the via insulation layer VIA may be patterned to expose at least a portion of the protrusion PP in the contact area CA. Meanwhile, the via insulation layer VIA may cover an entire of the passivation layer PVX in the contact area CA except for at least a portion of the protrusion PP. For example, in the contact area CA, a portion of the via insulation layer VIA may extend to an inside of an opening penetrating the passivation layer PVX to cover one side of the passivation layer PVX. In this case, the other side opposite to one side of the passivation layer PVX covered by the via insulation layer VIA in a cross-sectional view may be exposed from the via insulation layer VIA. That is, the via insulation layer VIA may have an asymmetric cross-sectional shape based on a center of an opening penetrating the via insulation layer VIA in the contact area CA. Accordingly, the common electrode CTE may be formed along a profile of the via insulation layer VIA in the contact area CA.

The thin film inorganic layer TIL may be disposed between the passivation layer PVX and the via insulation layer VIA. For example, the thin film inorganic layer TIL may cover the passivation layer PVX overlapping the via insulation layer VIA. That is, the thin film inorganic layer TIL may be disposed on the passivation layer PVX to correspond to the via insulation layer VIA.

As shown in FIG. 5, the thin film inorganic layer TIL may be patterned to expose at least a portion of the protrusion PP in the contact area CA. Meanwhile, the thin film inorganic layer TIL may cover an entire of the passivation layer PVX in the contact area CA except for at least a portion of the protrusion PP.

In some cases, the thin film inorganic layer TIL may be formed of an inorganic insulating material. Examples of inorganic insulating materials that can be used as the thin film inorganic layer TIL may include silicon oxide, silicon nitride, silicon oxynitride, or the like. These may be used alone or in combination with each other. Also, the thin film inorganic layer TIL may have a single-layer structure or a multi-layer structure. In some cases, a thickness of the thin film inorganic layer TIL may be smaller than a thickness of the passivation layer PVX.

The pixel electrode ADE may be disposed in the display area DA on the via insulation layer VIA. The pixel electrode ADE may be electrically connected to the transistor TR. For example, the pixel electrode ADE may correspond to the first terminal of the light emitting device LED described with reference to FIG. 3. In some cases, the pixel electrode ADE may be formed of metal, alloy, conductive metal oxide, transparent conductive material, or the like. Examples of materials that can be used as the pixel electrode ADE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The capping electrode CPE may be disposed on the interlayer insulation layer ILD, the passivation layer PVX, and the via insulation layer VIA in the contact area CA. For example, the capping electrode CPE may protect structures under the capping electrode CPE from external influences.

The capping electrode CPE may contact the power line VL in the contact area CA. Specifically, the capping electrode CPE may contact the side surface CL1-S of the first conductive layer CL1 in the contact area CA. For example, the capping electrode CPE may pass through an upper surface of the interlayer insulation layer ILD and extend to the side surface CL1-S of the first conductive layer CL1.

In some cases, the capping electrode CPE and the pixel electrode ADE may be formed together within the same process. In other words, the capping electrode CPE and the pixel electrode ADE may be disposed on the same layer, and the capping electrode CPE and the pixel electrode ADE may include the same material.

For example, the capping electrode CPE may be formed of a metal, an alloy, a conductive metal oxide, a transparent conductive material, or the like. Examples of materials that can be used as the capping electrode CPE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The capping electrode CPE may have sections that are disconnected from each other in the contact area CA by the organic encapsulation layer OEL and the protrusion PP of the passivation layer PVX. In other words, portions of the capping electrode CPE may be disconnected or separated by the undercut shape UC in the contact area CA.

The pixel defining layer PDL may be disposed in the display area DA on the via insulation layer VIA. The pixel defining layer PDL may partially cover the pixel electrode ADE on the via insulation layer VIA. The pixel defining layer PDL may have a pixel opening exposing at least a portion of an upper surface of the pixel electrode ADE. In some cases, the pixel defining layer PDL may be formed of an insulating material. Examples of the insulating material that can be used as the pixel defining layer PDL may include photoresist, polyacrylic resin, polyimide resin, acrylic resin, or the like. These may be used alone or in combination with each other.

The emission layer EL may be disposed in the display area DA on the via insulation layer VIA, the pixel electrode ADE, the capping electrode CPE, and the pixel defining layer PDL. In particular, the emission layer EL may be formed on an entire surface of the display area DA of the display device DD. In some cases, the emission layer EL may have a multilayer structure including a hole injection layer, a hole transport layer, an organic emission layer, an electron transport layer, and an electron injection layer. In some cases, a thickness of the emission layer EL may be smaller than or the same as the thickness of the passivation layer PVX.

Regions of the emission layer EL may be disconnected from each other in the contact area CA by structure including the protrusion PP of the passivation layer PVX. In other words, the undercut shape UC in the contact area CA may disconnect the emission layer EL.

The common electrode CTE may be disposed on the emission layer EL. In other words, the common electrode CTE may be formed on the entire surface of the display area DA of the display device DD. The common electrode CTE may correspond to the second terminal of the light emitting device LED described with reference to FIG. 3.

In some cases, the common electrode CTE may be formed of a metal, an alloy, a conductive metal oxide, a transparent conductive material, or the like. Examples of materials that can be used as the common electrode CTE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other. Also, the common electrode CTE may have a single-layer or multi-layer structure including one or multiple layers.

Since the structure including the protrusion PP disconnects and creates an opening between portions of the emission layer EL in the contact area CA, the common electrode CTE may contact the capping electrode CPE in the contact area CA. Accordingly, the common electrode CTE may be electrically connected to the power line VL through the capping electrode CPE in the contact area CA. In some cases, the common electrode CTE may cover one side of the emission layer EL.

In some cases, the common electrode CTE may be disconnected in the contact area CA by the protrusion PP of the passivation layer PVX. In other words, portions of the common electrode CTE may be disconnected by the undercut shape UC in the contact area CA.

The pixel electrode ADE, the emission layer EL, and the common electrode CTE may form the light emitting device LED. The light emitting device LED may correspond to the light emitting device LED with reference to FIG. 3.

The encapsulation layer ENC may be disposed on the common electrode CTE and cover the light emitting device LED. The encapsulation layer ENC may seal the display area DA to protect the light emitting device LED from external impurities.

In some cases, the encapsulation layer ENC may include at least one inorganic encapsulation layer and at least one organic encapsulation layer. For example, as shown in FIG. 4, the encapsulation layer ENC may include a first inorganic encapsulation layer IEL1, an organic encapsulation layer OEL disposed on the first inorganic encapsulation layer IEL1, and a second inorganic encapsulation layer IEL2 disposed on the organic encapsulation layer OEL. However, the structure of encapsulation layer ENC is not necessarily limited thereto.

The first inorganic encapsulation layer IEL1 may be disposed on the common electrode CTE. For example, the first inorganic encapsulation layer IEL1 may have a substantially uniform thickness along a profile of the common electrode CTE.

The organic encapsulation layer OEL may be disposed on the first inorganic encapsulation layer IEL1. The organic encapsulation layer OEL may have a substantially flat upper surface without creating a step around the first inorganic encapsulation layer IEL1. In some cases, the organic encapsulation layer OEL may fill an empty space of the contact area CA by the undercut shape UC.

The second inorganic encapsulation layer IEL2 may be disposed on the organic encapsulation layer OEL. The second inorganic encapsulation layer IEL2 may have a substantially uniform thickness and a substantially flat upper surface.

FIGS. 6 to 19 are cross-sectional views illustrating a method of manufacturing the display device of FIG. 1.

Figure 6:
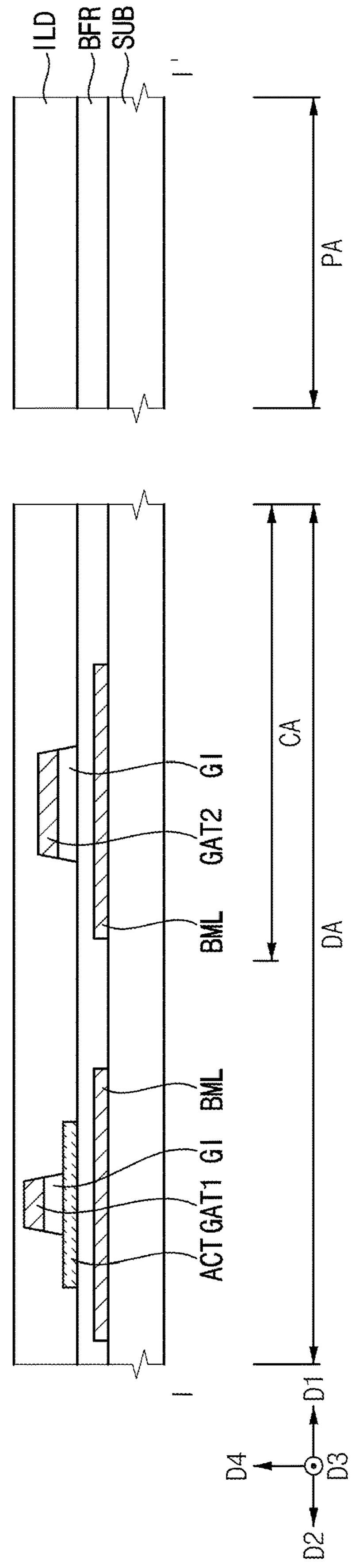
FIGS. 6 to 19 are cross-sectional views illustrating a manufacturing method of the display device of FIG. 1.

Referring to FIG. 6, the substrate SUB having the display area DA and the pad area PA may be prepared. For example, the pad area PA may be located on one side of the display area DA. The contact area CA may be located in the display area DA. In some cases, the substrate SUB may be a transparent insulating substrate. For example, the substrate SUB may be formed of glass, quartz, or plastic.

The lower metal layer BML may be formed in the display area DA on the substrate SUB, and the buffer layer BFR may be formed on the lower metal layer BML on the substrate SUB. For example, the buffer layer BFR may be entirely formed in the display area DA and the pad area PA on the substrate SUB. The buffer layer BFR formed in the display area DA may cover the lower metal layer BML on the substrate SUB.

The active pattern ACT may be formed in the display area DA on the substrate SUB. For example, the active pattern ACT may be formed using amorphous silicon, polycrystalline silicon, or an oxide semiconductor.

The gate insulation layer GI may be formed on the buffer layer BFR and the active pattern ACT. In some cases, the gate insulation layer GI may be formed on the buffer layer BFR and the active pattern ACT in a form of a pattern. For example, the gate insulation layer GI may be formed using an inorganic insulating material such as silicon oxide, silicon nitride, or silicon oxynitride.

The first gate electrode GAT1 and the second gate electrode GAT2 may be formed on the gate insulation layer GI. The first gate electrode GAT1 may be formed to overlap the active pattern ACT. The second gate electrode GAT2 may be formed to overlap the contact area CA. For example, each of the first gate electrode GAT1 and the second gate electrode GAT2 may be formed using a metal, an alloy, a conductive metal oxide, a conductive metal nitride, a transparent conductive material, or the like.

The interlayer insulation layer ILD may be formed on the buffer layer BFR, the gate insulation layer GI, the first gate electrode GAT1, and the second gate electrode GAT2. For example, the interlayer insulation layer ILD may be entirely formed in the display area DA and the pad area PA on the buffer layer BFR. The interlayer insulation layer ILD formed in the display area DA may cover the first gate electrode GAT1 and the second gate electrode GAT2. For example, the interlayer insulation layer ILD may be formed using an inorganic insulating material such as silicon oxide, silicon nitride, or silicon oxynitride.

Figure 7:
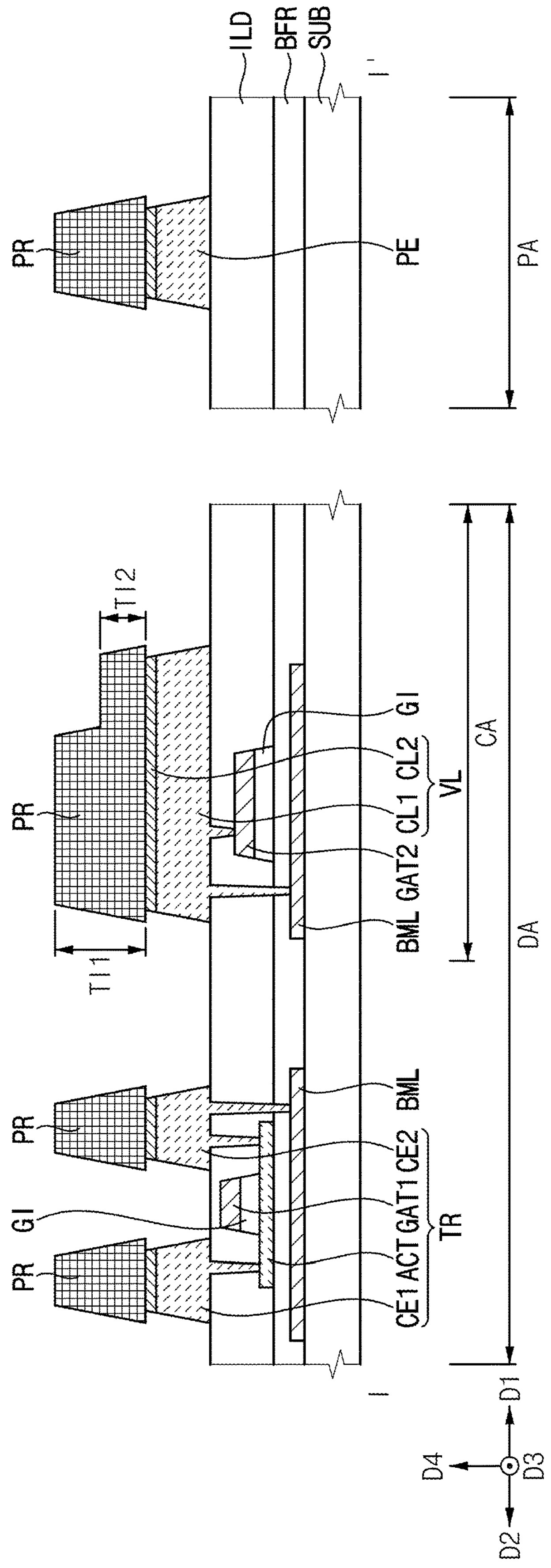

Referring to FIG. 7, the first connection electrode CE1, the second connection electrode CE2, the power line VL, and the pad electrode PE may be formed on the interlayer insulating layer ILD. For example, the pad electrode PE may be formed in the pad area PA on the interlayer insulation layer ILD, and the first connection electrode CE1, the second connection electrode CE2, and the power line VL may be formed in the display area DA on the interlayer insulation layer ILD. Specifically, the power line VL may be formed to overlap the contact area CA.

In some cases, the first connection electrode CE1 and the second connection electrode CE2 may penetrate the interlayer insulation layer ILD and contact the active pattern ACT. Also, the second connection electrode CE2 may be formed to contact the lower metal layer BML by penetrating the interlayer insulation layer ILD and the buffer layer BFR.

In some cases, the power line VL may penetrate the interlayer insulation layer ILD and contact the second gate electrode GAT2. In addition, the power line VL may penetrate the interlayer insulation layer ILD and the buffer layer BFR to contact the lower metal layer BML.

In some cases, the first connection electrode CE1, the second connection electrode CE2, the pad electrode PE, and the power line VL may be formed together within the same process. For example, the first connection electrode CE1, the second connection electrode CE2, the pad electrode PE, and the power line VL may be formed by forming a preliminary metal layer on the interlayer insulation layer ILD, forming a photoresist pattern PR on the preliminary metal layer, and patterning the preliminary metal using the photoresist pattern PR as a mask. In some cases, the photoresist pattern PR may include a photosensitive material.

In some cases, the photoresist pattern PR may be formed by forming a preliminary photoresist layer on the preliminary metal layer and patterning the preliminary photoresist layer using a halftone mask or the like. For example, the preliminary photoresist layer may be formed to cover the preliminary metal layer.

By patterning the preliminary photoresist layer using a halftone mask or the like, the photoresist pattern PR may have a first portion having a first thickness T11 and a second portion having a second thickness T12 smaller than the first thickness T11. For example, after the preliminary metal layer is patterned, the photoresist pattern PR disposed on the power line VL may include the first portion having the first thickness T11 and the second portion having the second thickness T12.

In some cases, the preliminary metal layer may include a first preliminary metal layer and a second preliminary metal layer disposed on the first preliminary metal layer. Accordingly, each of the first connection electrode CE1, the second connection electrode CE2, the pad electrode PE, and the power line VL may have a multi-layered structure in which a conductive layer formed from the first preliminary metal layer and a conductive layer formed from the second preliminary metal layer are stacked. For example, the power line VL may include a first conductive layer CL1 formed from the first preliminary metal layer and a second conductive layer CL2 formed from the second preliminary metal layer.

In some cases, the first conductive layer CL1 and the second conductive layer CL2 may be formed of different materials. For example, the first conductive layer CL1 may be formed of a metal material such as copper (Cu), and the second conductive layer CL2 may be formed of a transparent conductive oxide such as indium tin oxide (ITO).

Figure 8:
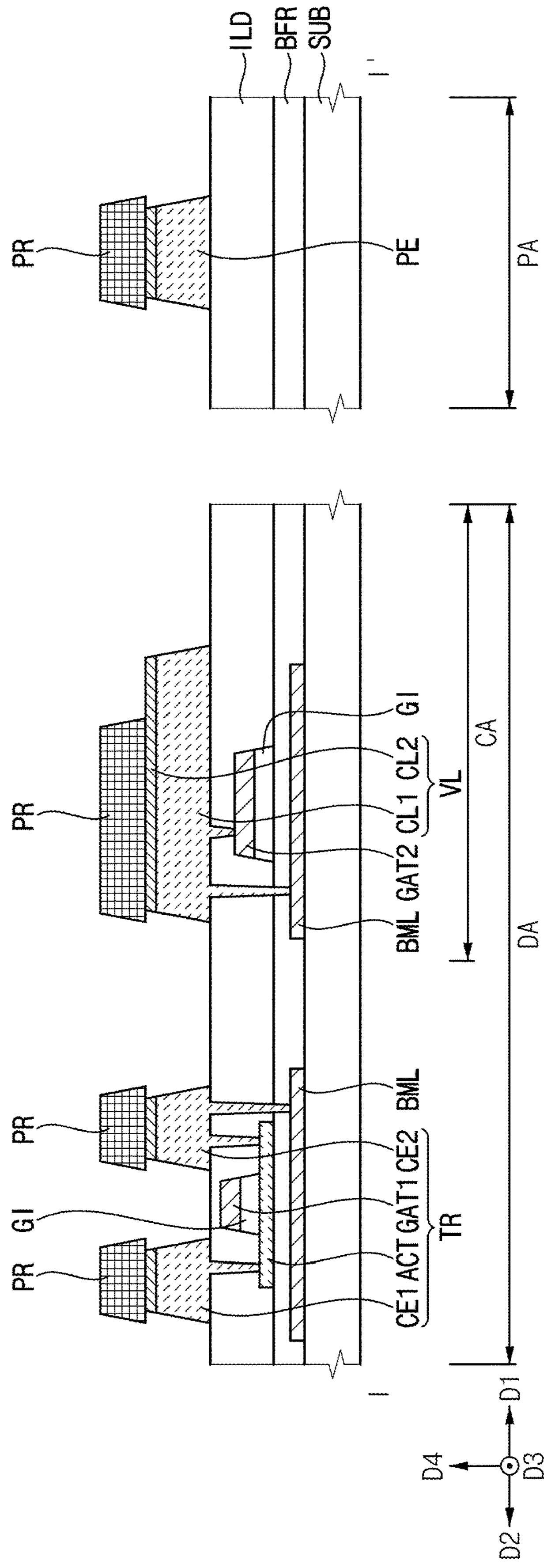

Referring to FIG. 8, a portion of the photoresist pattern PR may be removed. For example, a portion of the photoresist pattern PR may be removed through an ashing process. As a portion of the photoresist pattern PR is removed, a portion of the upper surface of the second conductive layer CL2 may be exposed. Specifically, the second portion of the photoresist pattern PR may be removed through an ashing process so that a portion of the upper surface of the second conductive layer CL2 is exposed. In this case, the first portion of the photoresist pattern PR may be removed as much as the second thickness T12.

Figure 9:
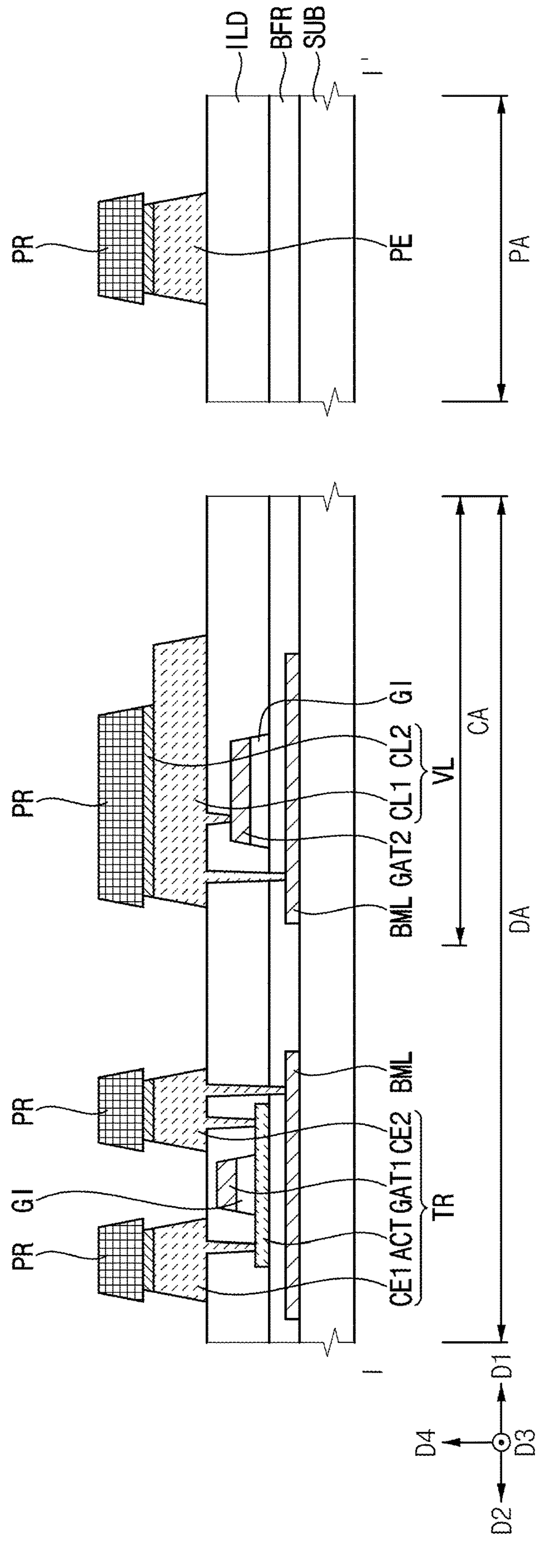

Further referring to FIG. 9, a portion of the second conductive layer CL2 exposed from the photoresist pattern PR may be removed. For example, a portion of the second conductive layer CL2 may be removed through an etching process. Specifically, the etching process may be a wet etching process using an etchant. A portion of the upper surface of the first conductive layer CL1 may be exposed by removing a portion of the second conductive layer CL2 exposed from the photoresist pattern PR.

In some cases, in a process of removing a portion of the second conductive layer CL2, the second conductive layer CL2 may be in an amorphous state. Accordingly, a portion of the second conductive layer CL2 may be removed through an etching process or the like.

Figure 10:
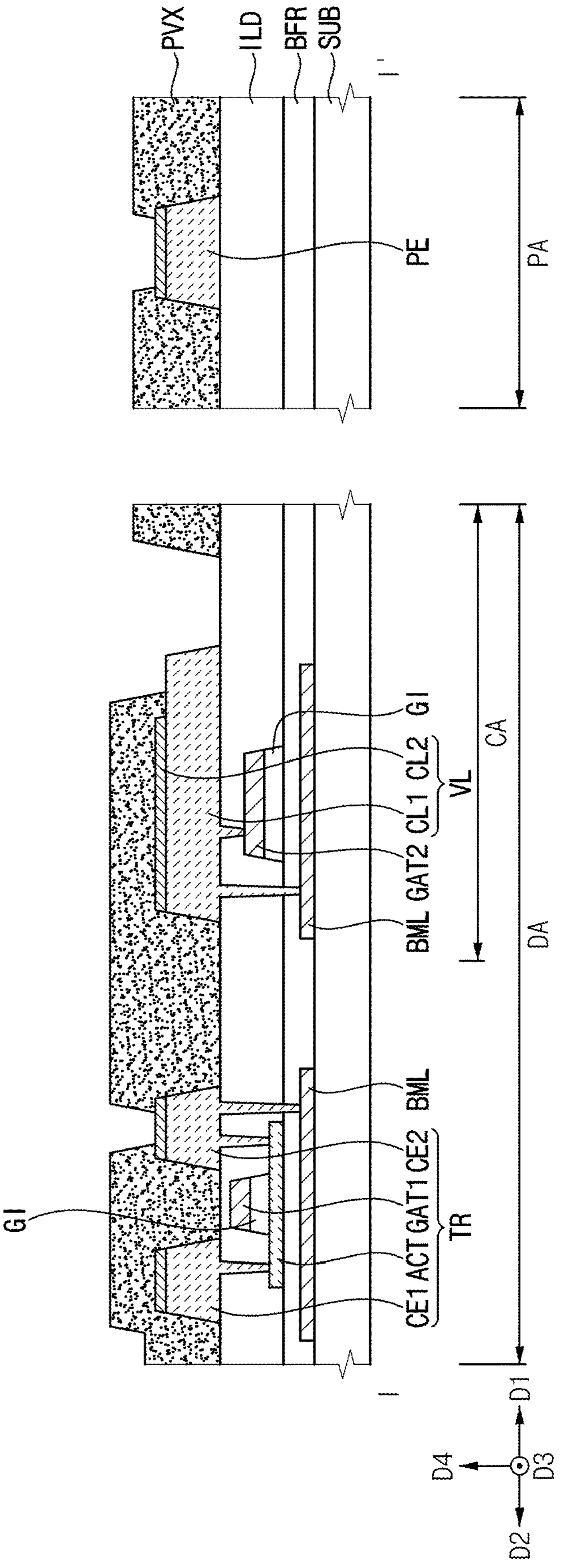

Referring to FIG. 10, the passivation layer PVX may be formed on the interlayer insulation layer ILD, the first connection electrode CE1, the second connection electrode CE2, the power line VL, and the pad electrode PE. For example, the passivation layer PVX may be entirely formed in the display area DA and the pad area PA on the interlayer insulation layer ILD.

In some cases, the passivation layer PVX may be formed using an inorganic insulating material such as silicon oxide, silicon nitride, or silicon oxynitride.

The passivation layer PVX may expose a portion of the first conductive layer CL1 in the contact area CA. Meanwhile, the passivation layer PVX may cover the second conductive layer CL2 in the contact area CA. In addition, the passivation layer PVX may expose a portion of the upper surface of the pad electrode PE in the pad area PA.

Figure 11:
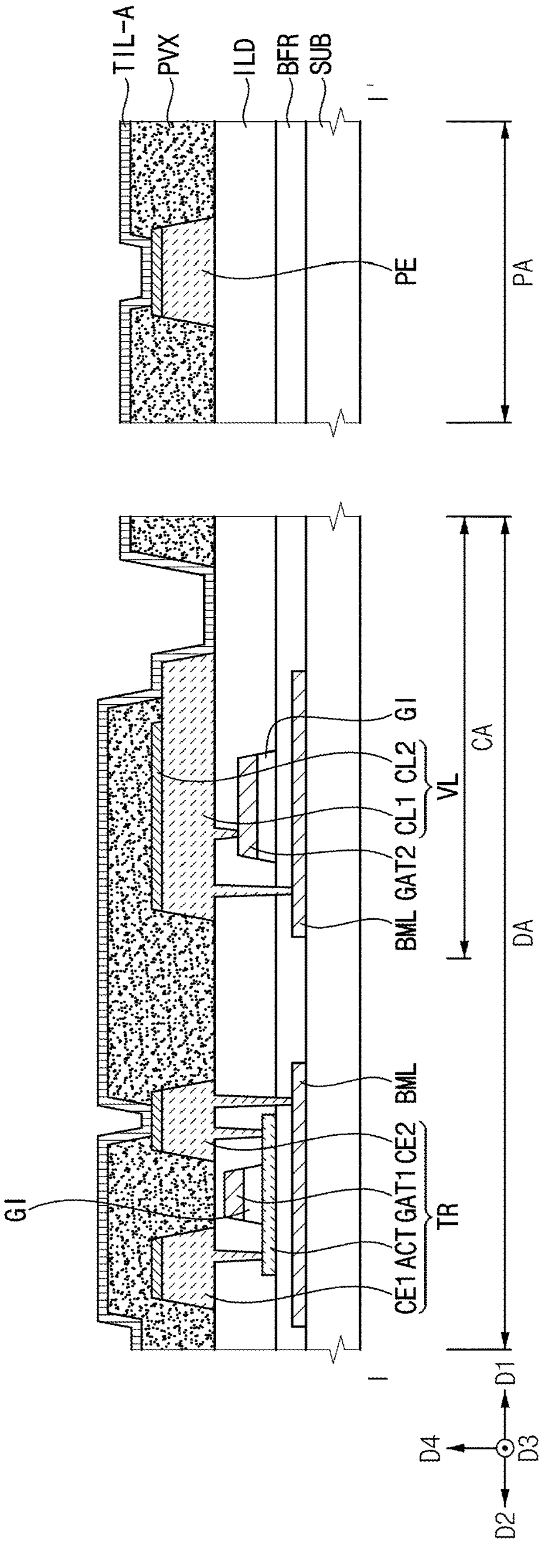

Referring to FIG. 11, a preliminary inorganic layer TIL-A may be formed on the interlayer insulation layer ILD, the first connection electrode CE1, the power line VL, the pad electrode PE, and the passivation layer PVX. For example, the preliminary inorganic layer TIL-A may be entirely formed in the display area DA and the pad area PA. The preliminary inorganic layer TIL-A may cover the passivation layer PVX. In addition, the preliminary inorganic layer TIL-A may cover a portion of the first conductive layer CL1 exposed from the passivation layer PVX. Accordingly, the preliminary inorganic layer TIL-A may prevent damage to the first conductive layer CL1 in a subsequent process (e.g., a process of forming the via insulation layer VIA).

In some cases, the preliminary inorganic layer TIL-A may be formed using an inorganic insulation material such as silicon oxide, silicon nitride, or silicon oxynitride. In some cases, the preliminary inorganic layer TIL-A may be formed to have a thickness smaller than a thickness of the passivation layer PVX.

Figure 12:
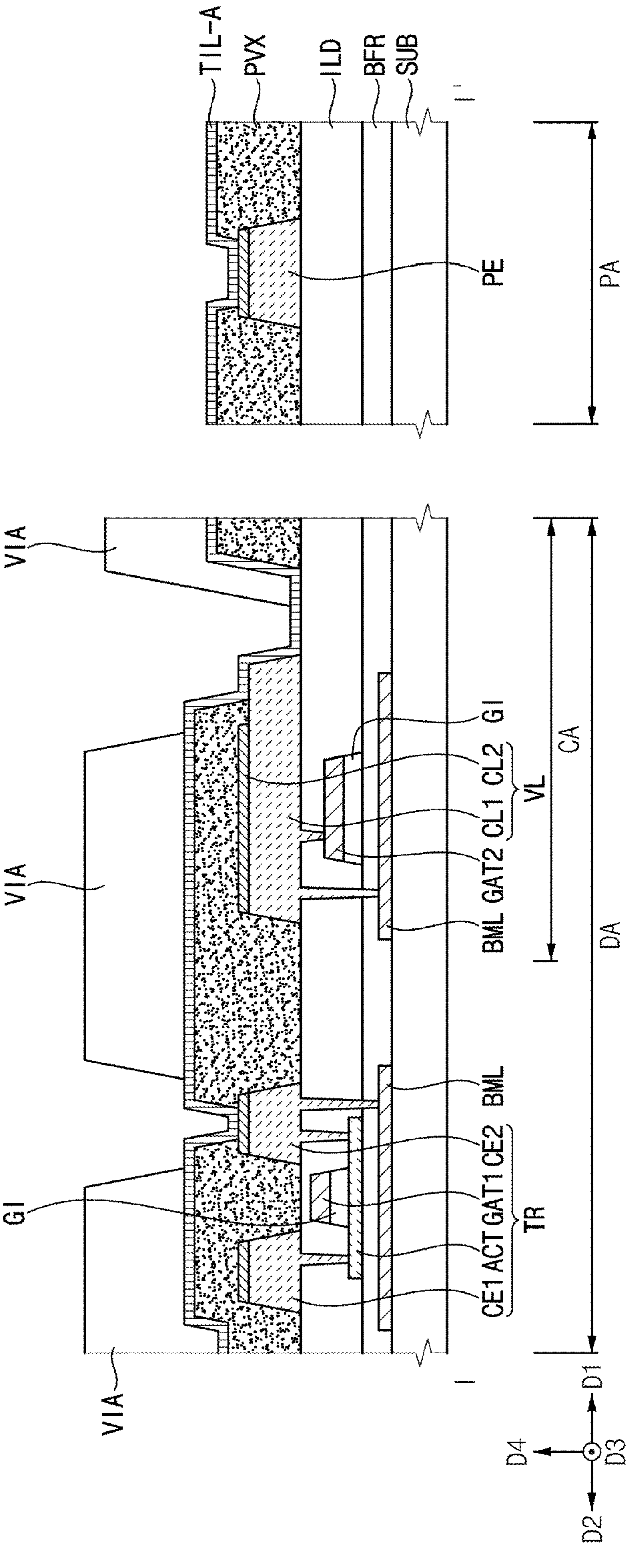

Referring to FIG. 12, the via insulation layer VIA may be formed on the preliminary inorganic layer TIL-A. For example, the via insulation layer VIA may be formed in the display area DA on the preliminary inorganic layer TIL-A. For example, the via insulation layer VIA may be formed by applying a preliminary via insulation layer (not shown) on the preliminary inorganic layer TIL-A and patterning the preliminary via insulation layer. The via insulation layer VIA may expose a portion of the preliminary inorganic layer TIL-A. That is, the via insulation layer VIA may cover a portion of the preliminary inorganic layer TIL-A.

In some cases, the via insulation layer VIA may be formed using an organic insulating material such as photoresist, polyacrylic resin, polyimide resin, or acrylic resin.

In some cases, a portion of the via insulation layer VIA may be formed to extend to an inside of an opening penetrating the passivation layer PVX to cover one side of the passivation layer PVX in the contact area CA. In this case, the other side opposite to one side of the passivation layer PVX covered by the via insulation layer VIA in a cross-sectional view may be exposed from the via insulation layer VIA. That is, the via insulation layer VIA may be formed to have an asymmetric cross-sectional shape based on a center of an opening penetrating the via insulation layer VIA in the contact area CA.

Figure 13:
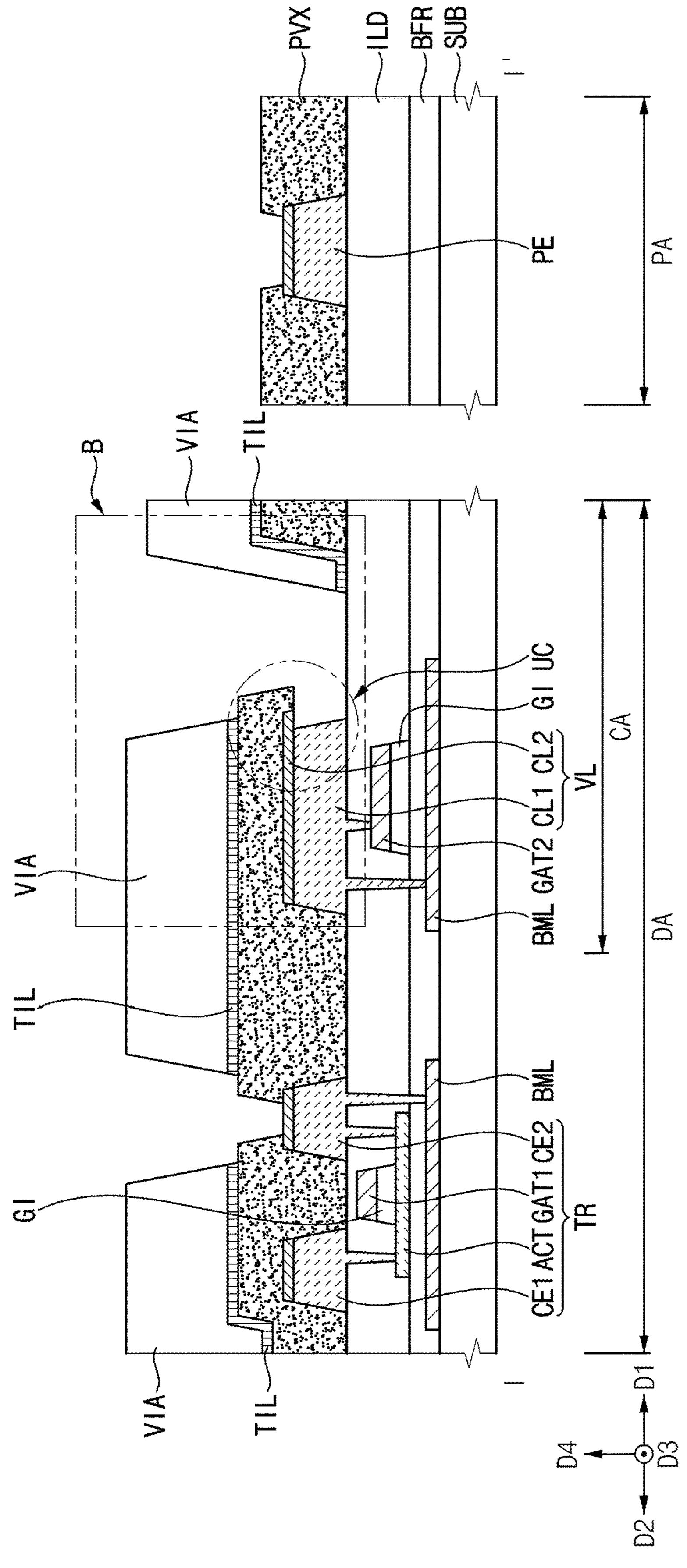
Figure 14:
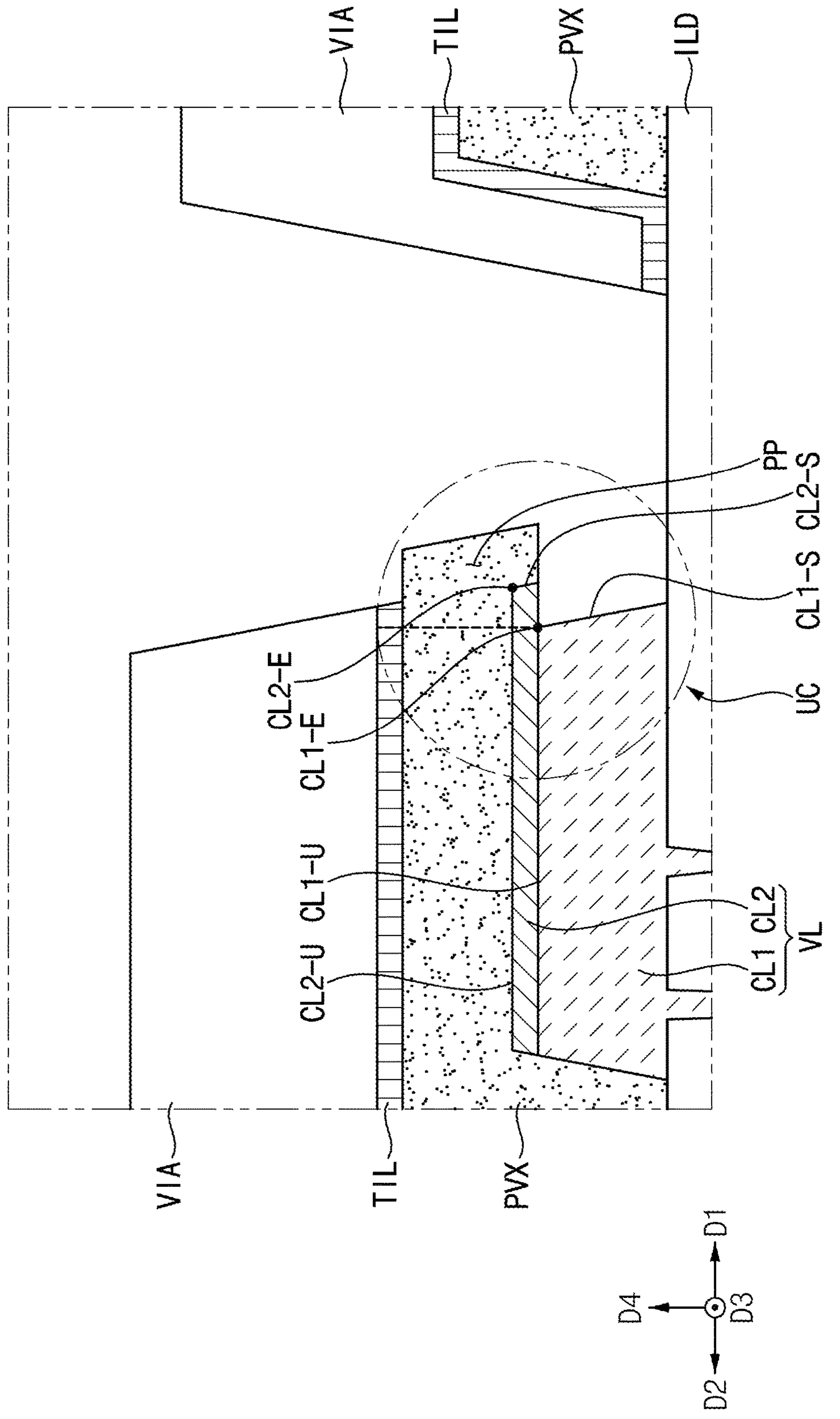

Further referring to FIGS. 13 and 14, a portion of the first conductive layer CL1 exposed from the passivation layer PVX may be removed. FIG. 14 is an enlarged view illustrating an enlarged area B of FIG. 13. In some cases, a portion of the first conductive layer CL1 may be removed through an etching process. For example, the etching process may be a wet etching process using an etchant.

In a process of removing a portion of the first conductive layer CL1 exposed from the passivation layer PVX, a portion of the first conductive layer CL1 overlapping the passivation layer PVX may also be removed. That is, after the process of removing a portion of the first conductive layer CL1, the side surface CL1-S of the first conductive layer CL1 may be more recessed in the second direction D2 than is the side surface of the passivation layer PVX. Accordingly, the passivation layer PVX may have the protrusion PP protruding in the first direction D1 with respect to the edge CL1-E of the upper surface CL1-U of the first conductive layer CL1 in the contact area CA. Accordingly, the undercut shape UC by the protrusion PP and the side surface CL1-S of the first conductive layer CL1 may be defined in the contact area CA.

Meanwhile, in the process of removing a portion of the first conductive layer CL1, a portion of the preliminary inorganic layer TIL-A exposed from the via insulation layer VIA may be removed together. Accordingly, the thin film inorganic layer TIL disposed between the passivation layer PVX and the via insulation layer VIA may be formed. As a portion of the first conductive layer CL1 and a portion of the preliminary inorganic layer TIL-A are removed, the side surface CL1-S of the first conductive layer CL1 may be exposed to outside. That is, the patterned passivation layer PVX may expose the side surface CL1-S of the first conductive layer CL1. In addition, the thin film inorganic layer TIL and the via insulation layer VIA may expose a portion of the protrusion PP of the passivation layer PVX.

In some cases, in the process of removing a portion of the first conductive layer CL1, the second conductive layer CL2 may be in a crystallized state. Accordingly, the second conductive layer CL2 may not be affected by the etching process for removing the first conductive layer CL1. Therefore, the second connection electrode CE2 and the pad electrode PE exposed from the passivation layer PVX may not be affected by the etching process for removing the first conductive layer CL1.

In some cases, after a portion of the first conductive layer CL1 exposed from the passivation layer PVX is removed, the edge CL2-E of the upper surface CL2-U of the second conductive layer CL2 may protrude further in the first direction D1 than the edge CL1-E of the upper surface CL1-U of the first conductive layer CL1. Accordingly, in a plan view, a portion of the second conductive layer CL2 may overlap the protrusion PP of the passivation layer PVX. Meanwhile, the passivation layer PVX may cover the side surface CL2-S of the second conductive layer CL2.

Figure 15:
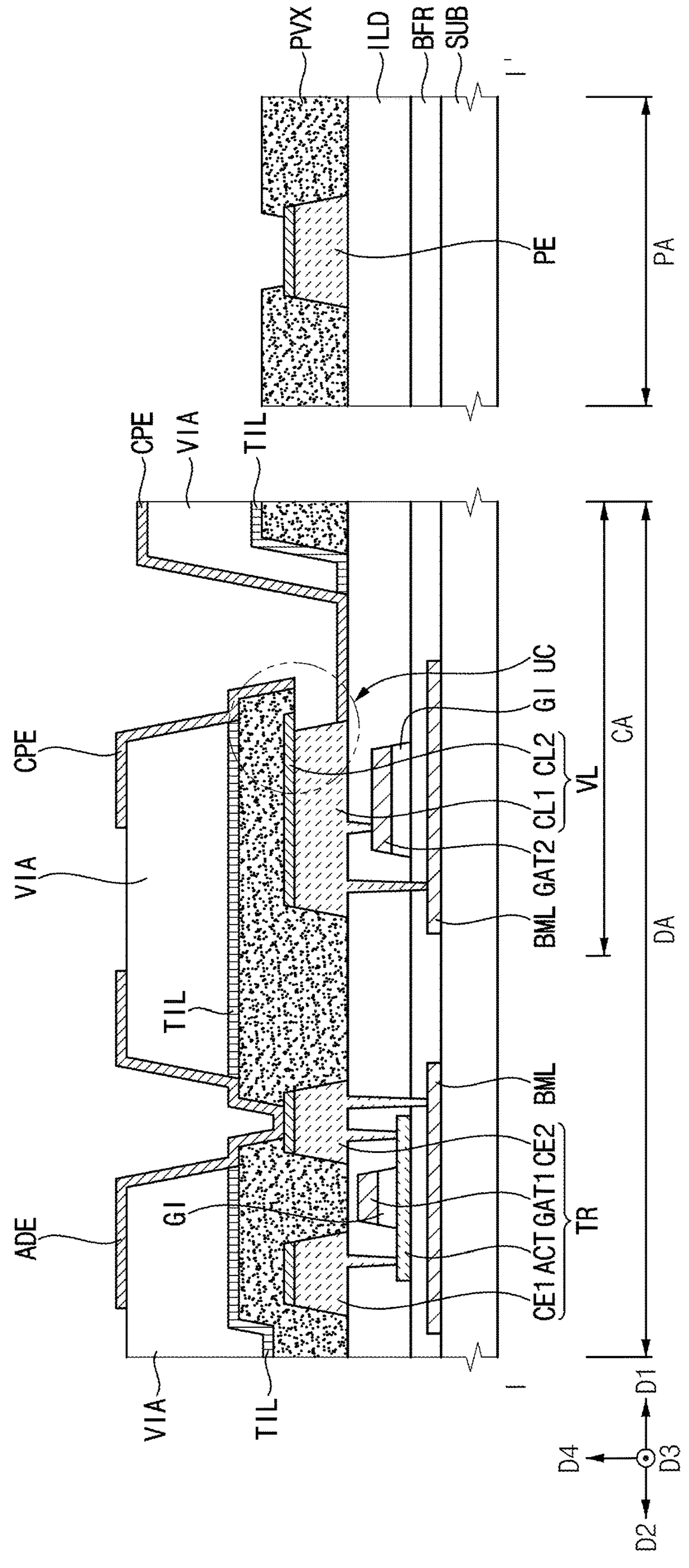

Referring to FIG. 15, the pixel electrode ADE and the capping electrode CPE may be formed. The pixel electrode ADE and the capping electrode CPE may be formed in the display area DA on the via insulation layer VIA. In detail, the capping electrode CPE may be formed on the interlayer insulation layer ILD, the passivation layer PVX, and the via insulation layer VIA in the contact area CA. The pixel electrode ADE may be electrically connected to the second connection electrode CE2. The capping electrode CPE may contact the power line VL in the contact area CA.

In some cases, the pixel electrode ADE and the capping electrode CPE may be formed together within the same process. For example, the pixel electrode ADE and the capping electrode CPE may be formed by applying a preliminary electrode layer on the interlayer insulation layer ILD, the passivation layer PVX, and the via insulating layer VIA, and patterning the preliminary electrode layer.

The preliminary electrode layer may be formed using a metal, an alloy, a conductive metal oxide, a conductive metal nitride, a transparent conductive material, or the like. That is, the pixel electrode ADE and the capping electrode CPE may be formed using a metal, an alloy, a conductive metal oxide, a conductive metal nitride, a transparent conductive material, or the like.

Figure 16:
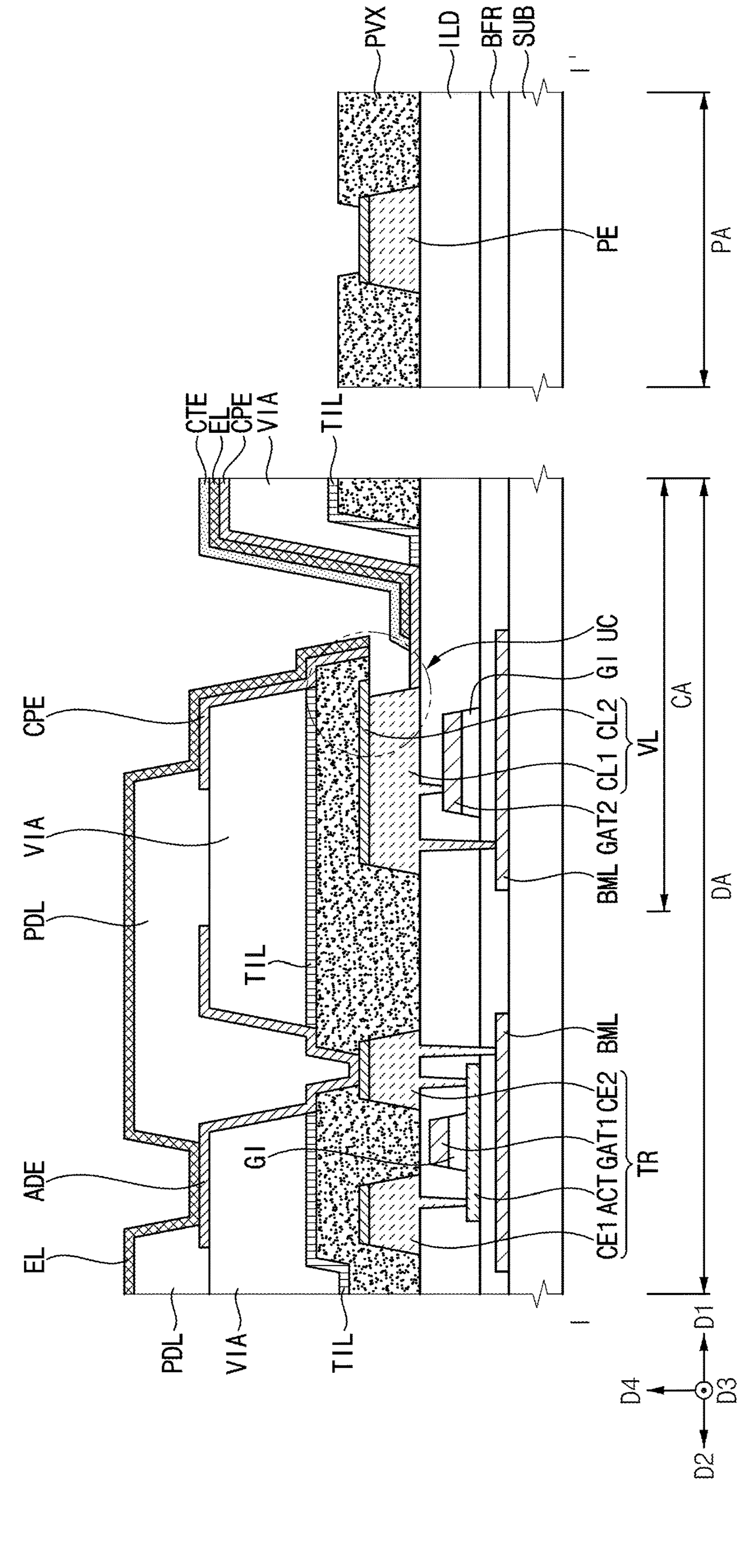
Figure 17:
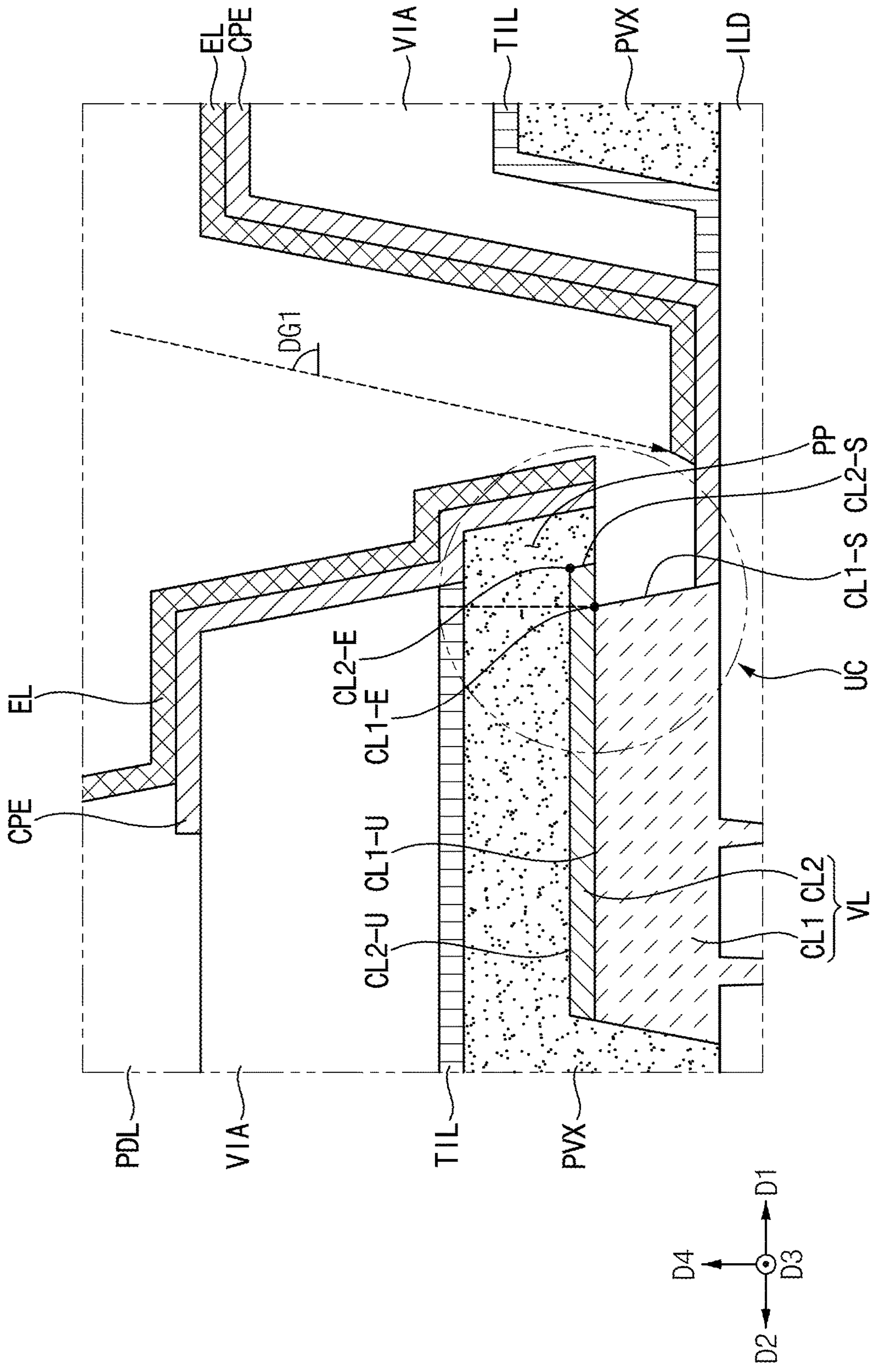

Referring to FIGS. 16 and 17, the pixel defining layer PDL may be formed in the display area DA on the via insulation layer VIA. The pixel defining layer PDL may partially cover the pixel electrode ADE on the via insulation layer VIA. The pixel defining layer PDL may have a pixel opening exposing at least a portion of an upper surface of the pixel electrode PE. For example, the pixel defining layer PDL may be formed using an insulating material such as photoresist, polyacrylic resin, polyimide resin, or acrylic resin.

Thereafter, the emission layer EL may be formed in the display area DA on the via insulation layer VIA, the pixel electrode ADE, the capping electrode CPE, and the pixel defining layer PDL. In other words, the emission layer EL may be formed on an entire surface of the display area DA of the display device DD.

The emission layer EL may be formed on the capping electrode CPE in the contact area CA. As shown in FIG. 17, the emission layer EL may be deposited at a first angle DG1. Portions of the emission layer EL may be disconnected in the contact area CA by structure including the protrusion PP of the passivation layer PVX. In other words, the emission layer EL may be disconnected by the undercut shape UC.

Figure 18:
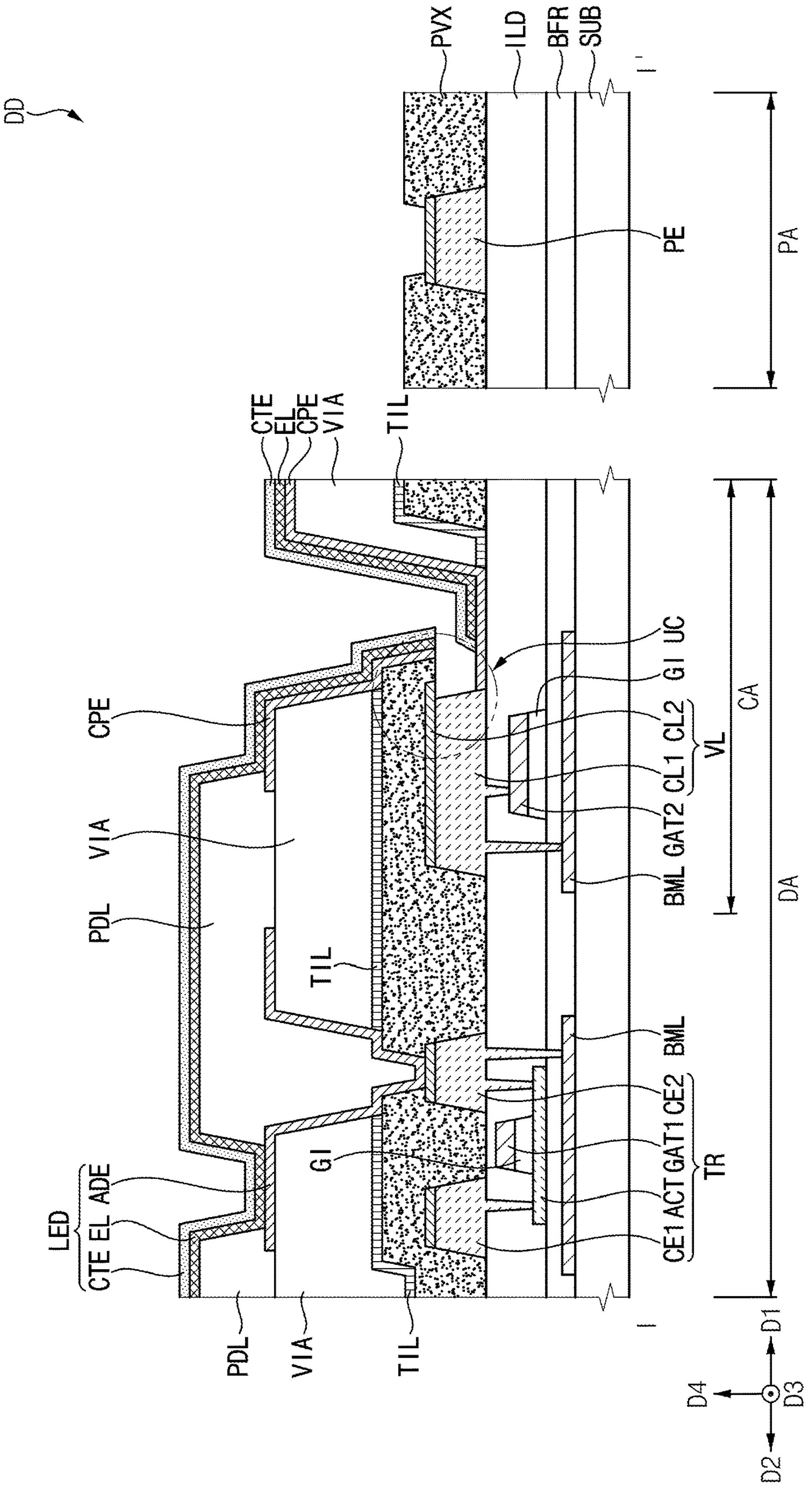
Figure 19:
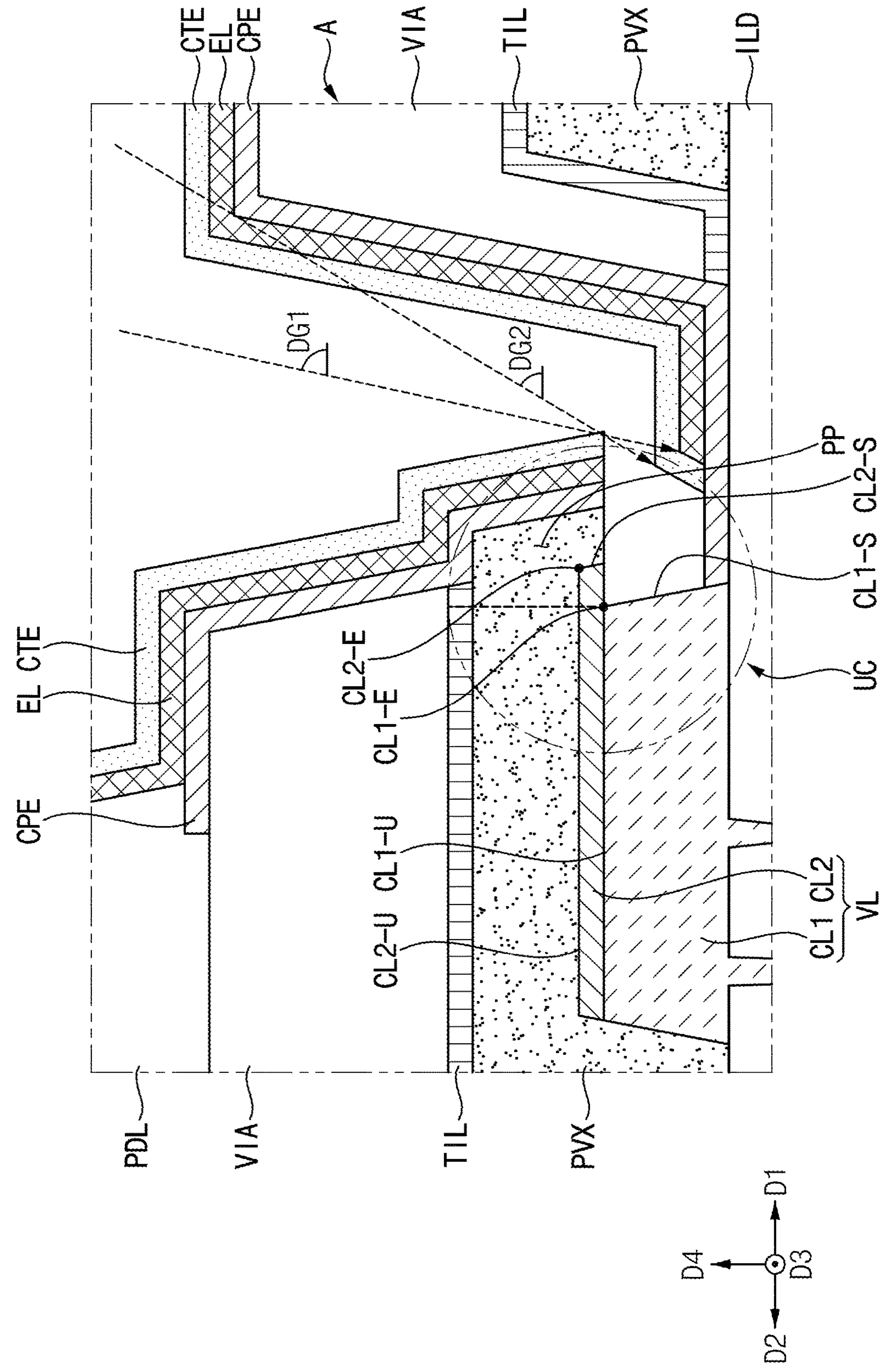

Referring to FIGS. 18 and 19, the common electrode CTE may be formed on the emission layer EL. The common electrode CTE may be formed on an entire surface of the display area DA of the display device DD.

As the emission layer EL is disconnected in the contact area CA by the protrusion PP, the common electrode CTE may directly contact the capping electrode CPE in the contact area CA. Accordingly, the common electrode CTE may be electrically connected to the power line VL through the capping electrode CPE in the contact area CA. In some cases, the common electrode CTE may be formed to cover one side surface of the emission layer EL in the contact area CA.

As shown in FIG. 19, the common electrode CTE may be deposited at a second angle DG2. For example, the first angle DG1 may be greater than the second angle DG2. In other words, the common electrode CTE may be deposited at a lower deposition angle than the emission layer EL.

In some cases, portions of the common electrode CTE may be disconnected in the contact area CA by structure including the protrusion PP of the passivation layer PVX. In other words, the common electrode CTE may be disconnected by the undercut shape UC.

Thereafter, as shown in FIG. 4, the encapsulation layer ENC may be formed on the common electrode CTE. For example, the first inorganic encapsulation layer IEL1, the organic encapsulation layer OEL, and the third inorganic encapsulation layer IEL2 may be sequentially formed.

In some cases, the encapsulation layer ENC may be formed while filling an empty space formed by the undercut shape UC. For example, the first inorganic encapsulation layer IEL1 may be formed along a profile of the common electrode CTE, the organic encapsulation layer OEL may be formed to fill the empty space of the undercut shape UC, and the layer IEL2 may be formed on the organic encapsulation layer OEL.

As disclosed herein, the display device DD may include the power line VL, the passivation layer PVX, and the common electrode CTE. The power line VL may include the first conductive layer CL1 and the second conductive layer CL2 disposed on the first conductive layer CL1. The passivation layer PVX may have a protrusion PP protruding in one direction from the edge CL1-E of the upper surface CL1-U of the first conductive layer CL1 in the contact area CA.

Accordingly, the display device DD may have the undercut shape UC defined by the protrusion PP and the side surface CL1-S of the first conductive layer CL1. Accordingly, the common electrode CTE may be electrically connected to the power line VL in the contact area CA. Accordingly, a voltage drop of the common voltage ELVSS provided to the common electrode CTE may be prevented or reduced. Accordingly, the display quality of the display device DD may be improved.

Figure 20:
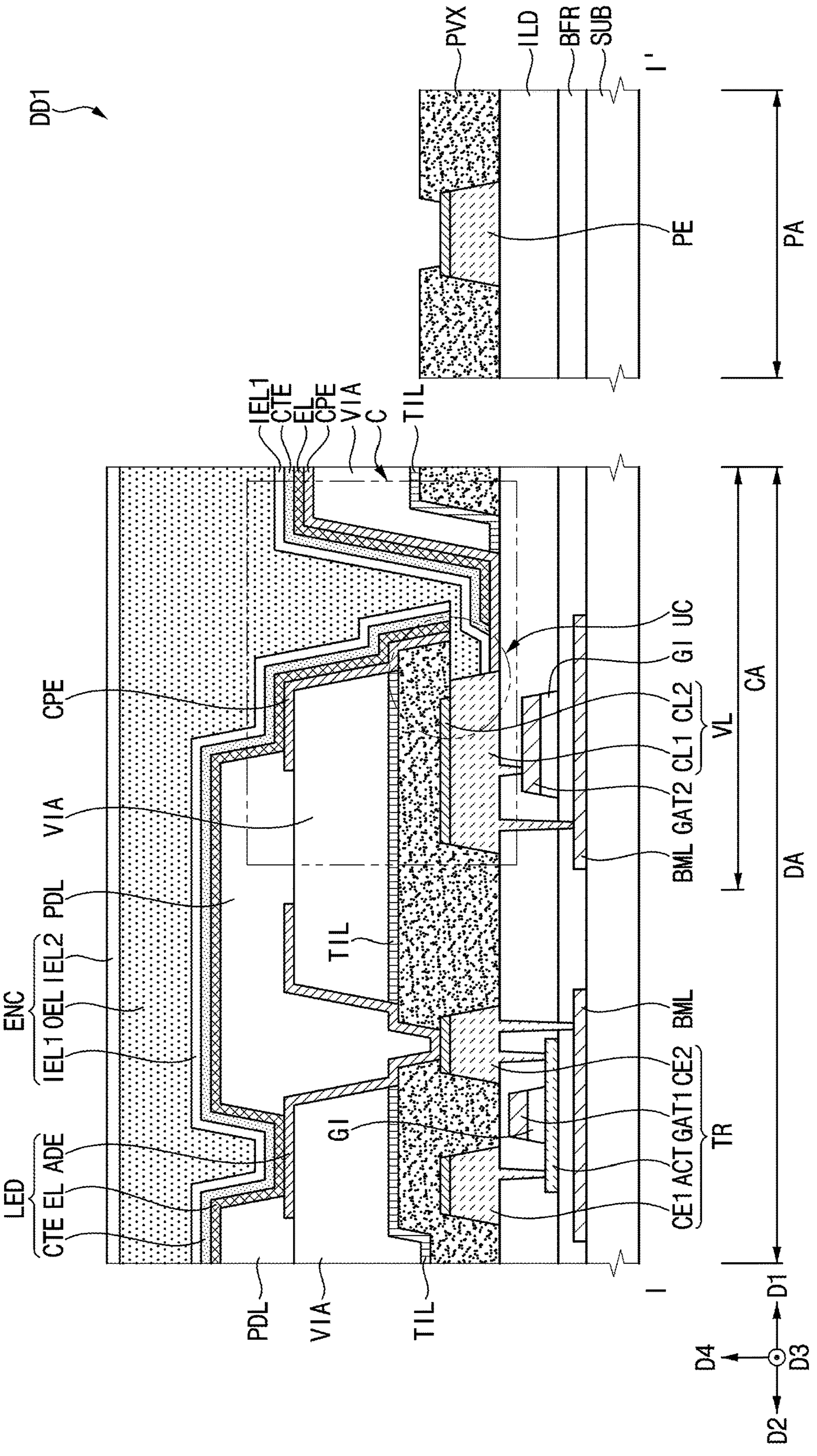
FIG. 20 is a cross-sectional view illustrating a display device according to another example of the present disclosure.
Figure 21:
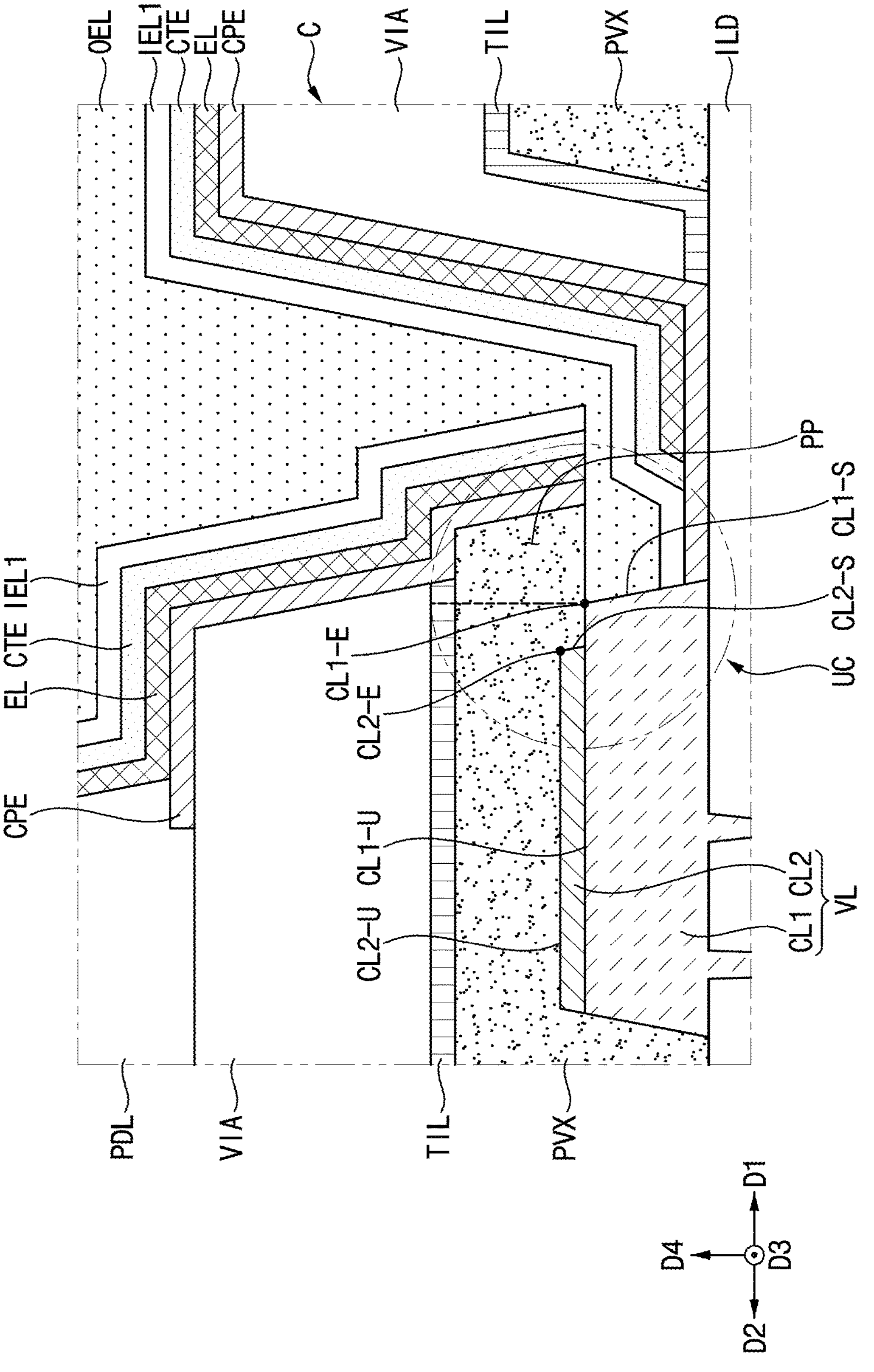
FIG. 21 is an enlarged view of area C of FIG. 20.

FIG. 20 is a cross-sectional view illustrating a display device DD1 according to another example of the present disclosure, and FIG. 21 is an enlarged view of an area C of FIG. 21.

Referring to FIGS. 20 and 21, the display device DD1 may be substantially same as the display device DD described with reference to FIG. 4 except for a structure of the second conductive layer CL2.

In the illustrated example, the edge CL2-E of the upper surface CL2-U of the second conductive layer CL2 may be recessed in the second direction relative to the edge CL1-E of the upper surface CL1-U of the first conductive layer CL1. Also, the side surface CL2-S of the second conductive layer CL2 may be recessed in the second direction D2 relative to the side surface CL1-S of the first conductive layer CL1. In other words, the side surface CL1-S of the first conductive layer CL1 may protrude further in the first direction D1 than does the side surface CL2-S of the second conductive layer CL2.

For example, in the process of removing a portion of the first conductive layer CL1 (see FIGS. 13 and 14), a degree of removal of the first conductive layer CL1 may be adjusted such that the side surface CL2-S of the second conductive layer CL2 is depressed in the second direction D2 relative to the side surface CL1-S of the first conductive layer CL1 after a portion of the first conductive layer CL1 is removed.

Accordingly, an entire of the second conductive layer CL2 may be disposed between the first conductive layer CL1 and the passivation layer PVX. That is, the passivation layer PVX may cover the entire of the second conductive layer CL2. Accordingly, external influence on the second conductive layer CL2 may be further reduced. Accordingly, the reliability of the display device DD1 may be further improved.

Figure 22:
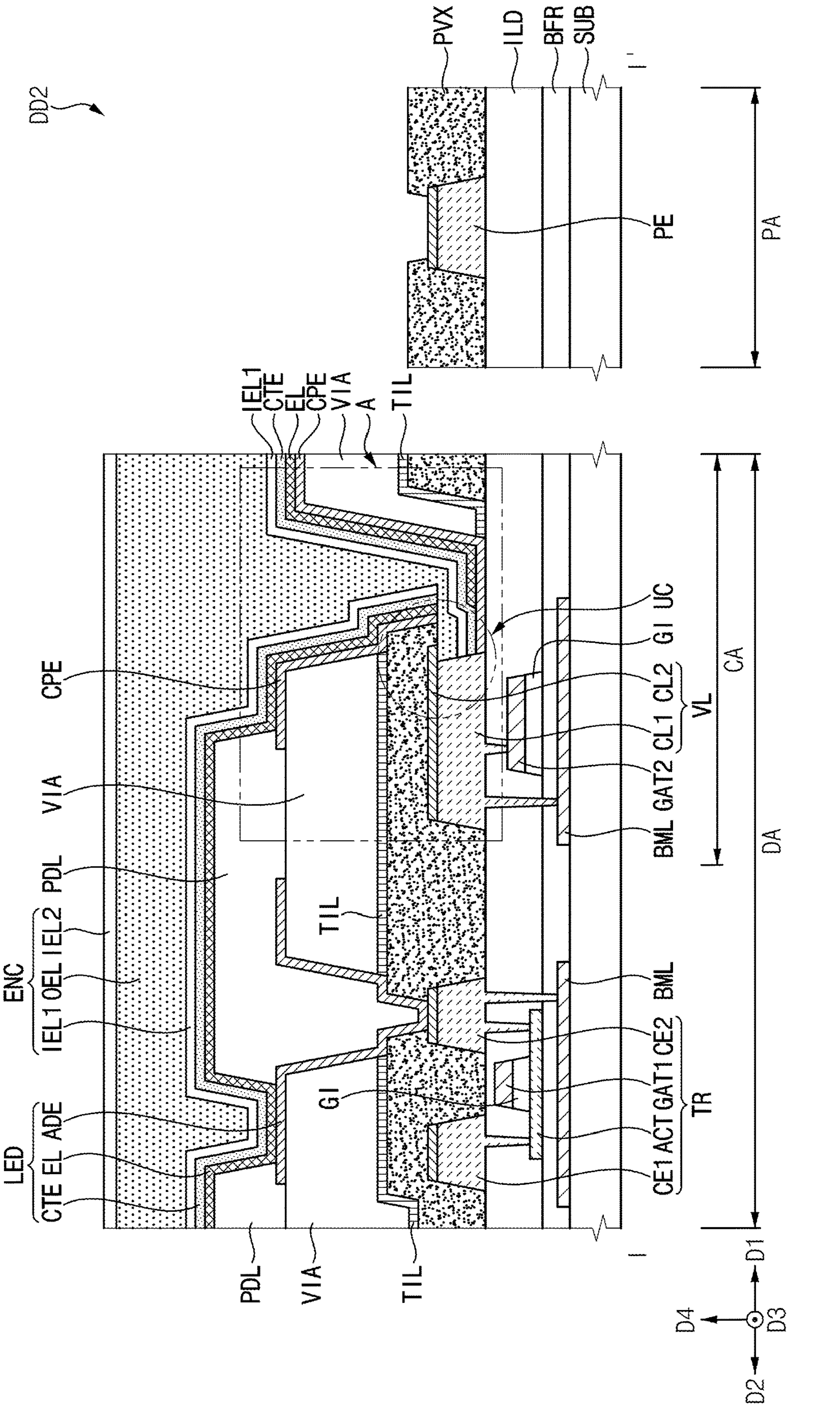
FIG. 22 is a cross-sectional view illustrating a display device according to another example of the present disclosure.

FIG. 22 is a cross-sectional view illustrating a display device DD2 according to another example of the present disclosure.

Referring to FIG. 22, the display device DD2 may be substantially same as the display device DD described with reference to FIG. 4 except for a structure of the common electrode CTE.

In some cases, the common electrode CTE may directly contact the power line VL in the contact area CA. For example, the common electrode CTE may directly contact the side surface CL1-S of the first conductive layer CL1 in the contact area CA. For example, the common electrode CTE may pass through an upper surface of the capping electrode CPE and extend to the side surface CL1-S of the first conductive layer CL1. Accordingly, the common electrode CTE and the power line VL may be directly electrically connected.

Figure 23:
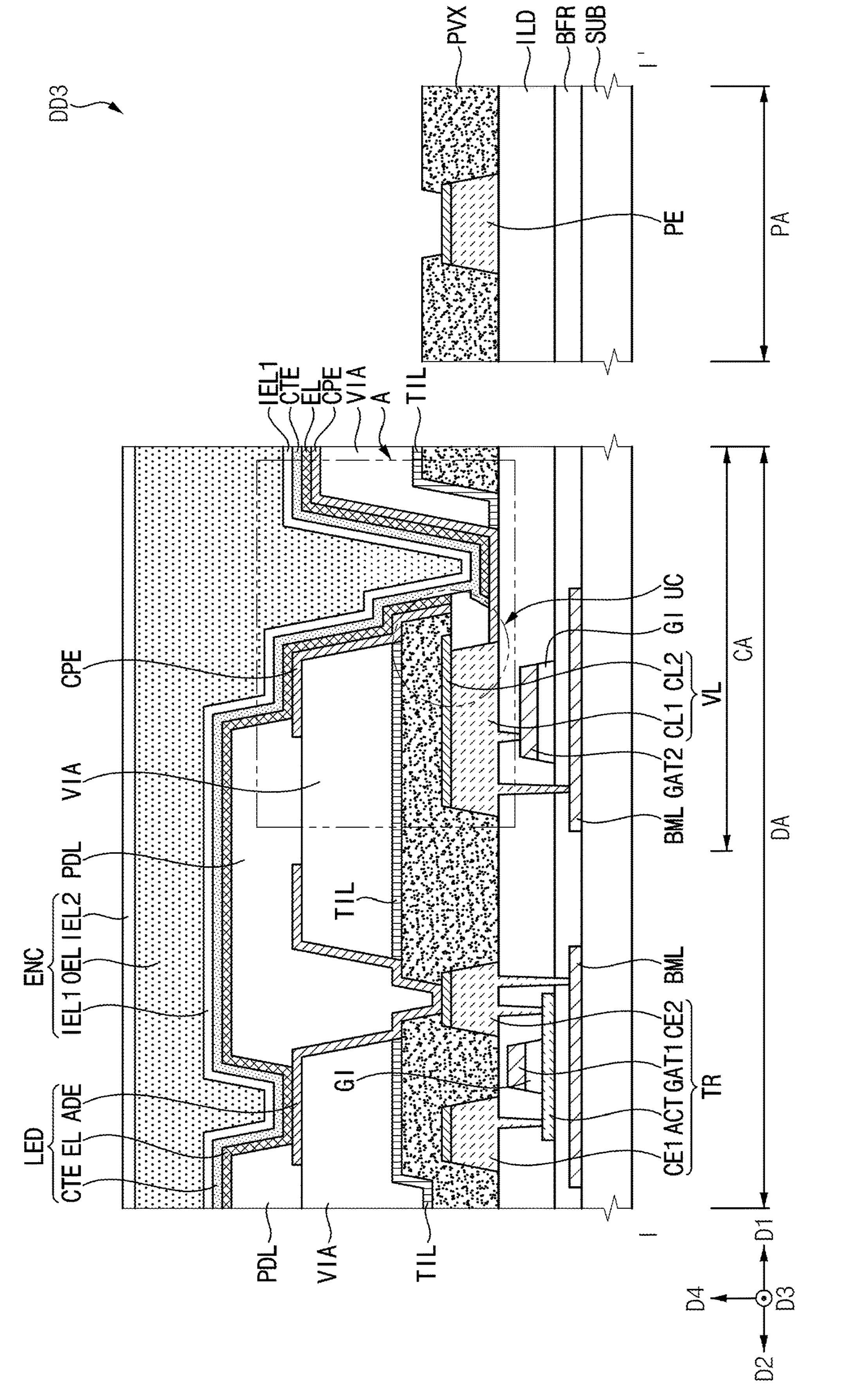
FIG. 23 is a cross-sectional view illustrating a display device according to another example of the present disclosure.

FIG. 23 is a cross-sectional view illustrating a display device DD3 according to yet another example of the present disclosure.

Referring to FIG. 23, the display device DD3 may be substantially same as the display device DD described with reference to FIG. 4 except for a structure of the common electrode CTE.

In this example, the common electrode CTE may be formed on an entire surface of the display area DA of the display device DD3 and may be entirely connected to the contact area CA. In other words, the common electrode CTE may not be disconnected by the undercut shape UC in the contact area CA. Even in this case, the common electrode CTE may contact the capping electrode CPE. Accordingly, the common electrode CTE may be electrically connected to the power line VL.

Also, although not shown, when the common electrode CTE is connected as a whole in the contact area CA, a separate organic material or the like may be filled in an empty space due to the undercut shape UC.

Figure 24:
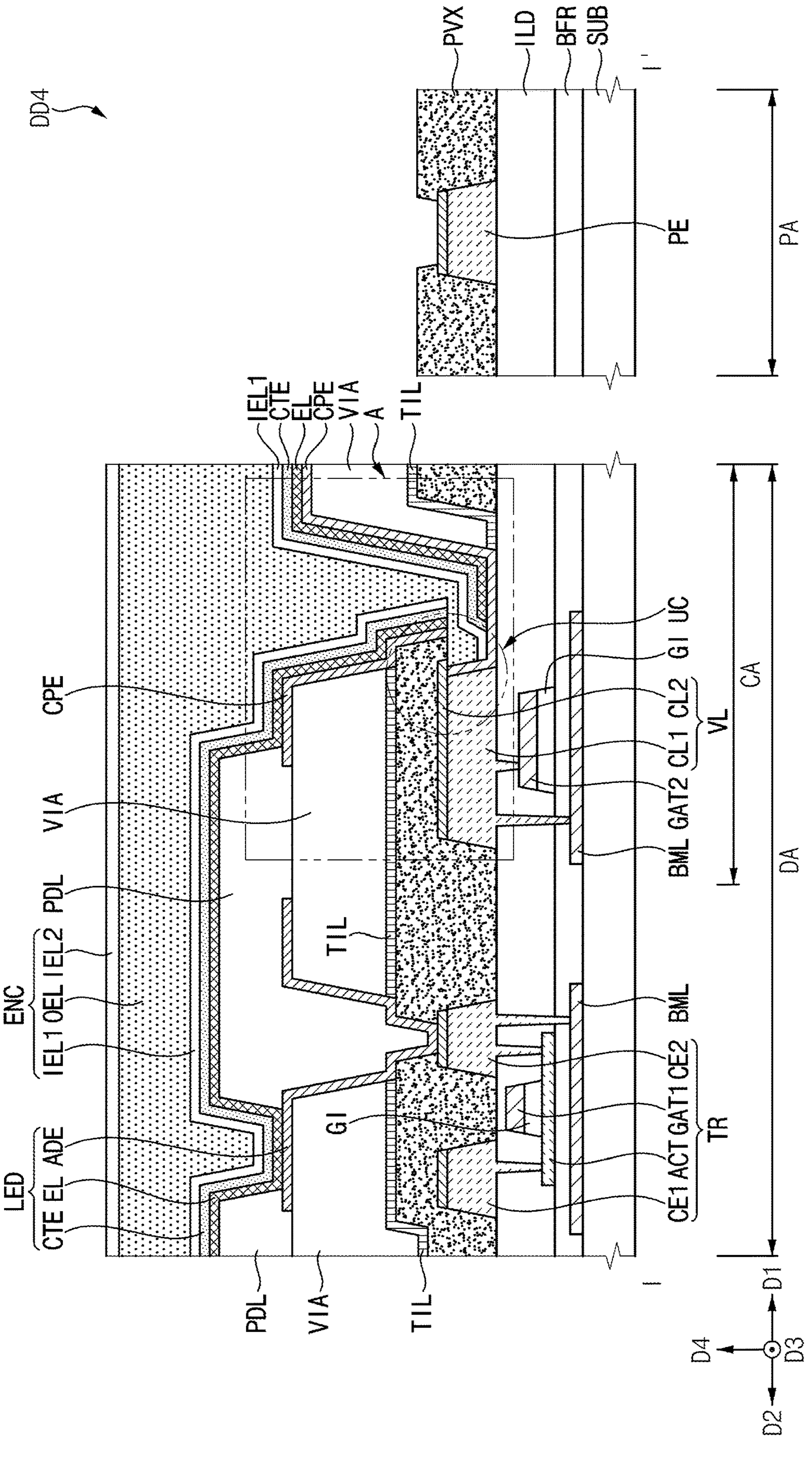
FIG. 24 is a cross-sectional view illustrating a display device according to another example of the present disclosure.

FIG. 24 is a cross-sectional view illustrating a display device DD4 according to another example of the present disclosure.

Referring to FIG. 24, the display device DD4 may be substantially same as the display device DD described with reference to FIG. 4 except for a structure of the capping electrode CPE.

In this example, the capping electrode CPE may cover the side surface CL1-S of the first conductive layer CL1 in the contact area CA. For example, the capping electrode CPE may pass through the upper surface of the interlayer insulation layer ILD, extend to the side surface CL1-S of the first conductive layer CL1, and cover the side surface CL1-S of the first conductive layer CL1. Meanwhile, FIG. 24 illustrates that the capping electrode CPE entirely covers the side surface CL1-S of the first conductive layer CL1, but the capping electrode CPE is not necessarily limited thereto. For example, the capping electrode CPE may cover a portion of the side surface CL1-S of the first conductive layer CL1 and expose a remaining portion of the side surface CL1-S of the first conductive layer CL1.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate having a display area and a contact area located in the display area;

a power line disposed in the display area on the substrate, overlapping the contact area, and including a first conductive layer and a second conductive layer disposed on the first conductive layer;

a passivation layer disposed on the substrate and the power line and having a protrusion protruding in a first direction with respect to an edge of an upper surface of the first conductive layer in the contact area; and a common electrode disposed on the substrate and the passivation layer and electrically connected to the power line in the contact area, wherein in the contact area, the passivation layer exposes a side surface of the first conductive layer, the side surface extending from the edge of the upper surface of the first conductive layer, and an undercut shape is defined in the contact area by the side surface of the first conductive layer and the protrusion.

2. The display device of claim 1, further comprising:

a capping electrode which is disconnected by the protrusion and contacts the side surface of the first conductive layer in the contact area.

3. The display device of claim 2, wherein the common electrode is electrically connected to the power line through the capping electrode.

4. The display device of claim 2, wherein the capping electrode covers the side surface of the first conductive layer.

5. The display device of claim 2, further comprising:

a transistor in the display area on the substrate; and a pixel electrode on the transistor and electrically connected to the transistor, and wherein the capping electrode and the pixel electrode are disposed on a same layer.

6. The display device of claim 1, wherein the common electrode contacts the side surface of the first conductive layer.

7. The display device of claim 1, wherein in the contact area, the passivation layer covers a side surface of the second conductive layer extending from an edge of an upper surface of the second conductive layer.

8. The display device of claim 7, wherein, in the contact area, the edge of the upper surface of the second conductive layer protrudes in the first direction beyond the edge of the upper surface of the first conductive layer.

9. The display device of claim 7, wherein, in the contact area, the edge of the upper surface of the second conductive layer is recessed from the edge of the upper surface of the first conductive layer in a second direction opposite to the first direction.

10. The display device of claim 1, further comprising:

a via insulation layer on the passivation layer and exposing at least a portion of the protrusion; and a thin film inorganic layer between the passivation layer and the via insulation layer.

11. The display device of claim 10, wherein in the contact area, the via insulation layer covers an entire of the passivation layer except for at least a portion of the protrusion.

12. The display device of claim 10, wherein a thickness of the thin film inorganic layer is smaller than a thickness of the passivation layer.

13. The display device of claim 12, wherein the first conductive layer includes at least one conductor out of copper (Cu) and aluminum (Al), and the second conductive layer includes at least one of a transparent conductive oxide, titanium (Ti), and molybdenum (Mo).

14. The display device of claim 1, wherein the passivation layer includes an inorganic insulating material.

15. The display device of claim 1, further comprising:

an emission layer which is disconnected by the protrusion in the contact area.

16. The display device of claim 1, further comprising:

a pad electrode disposed in a pad area located at one side of the display area on the substrate and disposed on a same layer as the power line, and wherein the passivation layer exposes at least a portion of an upper surface of the pad electrode.

* * * * *